United States Patent
Kusumoto et al.

(10) Patent No.: US 7,728,383 B2
(45) Date of Patent: Jun. 1, 2010

(54) SEMICONDUCTOR DEVICE HAVING A FIRST BASE, A THIN FILM TRANSISTOR, AND A SECOND BASE

(75) Inventors: Naoto Kusumoto, Isehara (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/260,107

(22) Filed: Oct. 29, 2008

(65) Prior Publication Data

US 2009/0057680 A1   Mar. 5, 2009

Related U.S. Application Data

(62) Division of application No. 11/435,804, filed on May 18, 2006, now Pat. No. 7,456,104.

(30) Foreign Application Priority Data

May 31, 2005   (JP)   ............................. 2005-158376

(51) Int. Cl.
  *H01L 29/10*   (2006.01)
  *H01L 29/76*   (2006.01)
  *H01L 27/12*   (2006.01)

(52) U.S. Cl. ................. 257/347; 257/66; 257/E29.117; 257/E29.151

(58) Field of Classification Search .................. 257/66, 257/347, E29.117, E29.151
See application file for complete search history.

(56) References Cited

U.S. PATENT DOCUMENTS 5,155,068 A   10/1992   Tada (Continued)

FOREIGN PATENT DOCUMENTS

EP   1 453 088   9/2004

(Continued)

OTHER PUBLICATIONS

Office Action (Application No. 200610088624.9) Dated Apr. 10, 2009.

(Continued)

*Primary Examiner*—Ngan Ngo
(74) *Attorney, Agent, or Firm*—Eric J. Robinson; Robinson Intellectual Property Law Office, P.C.

(57) ABSTRACT

To provide a thin film integrated circuit at low cost and with thin thickness, which is applicable to mass production unlike the conventional glass substrate or the single crystalline silicon substrate, and a structure and a process of a thin film integrated circuit device or an IC chip having the thin film integrated circuit. A manufacturing method of a semiconductor device includes the steps of forming a first insulating film over one surface of a silicon substrate, forming a layer having at least two thin film integrated circuits over the first insulating film, forming a resin layer so as to cover the layer having the thin film integrated circuit, forming a film so as to cover the resin layer, grinding a backside of one surface of the silicon substrate which is formed with the layer having the thin film integrated circuit, and polishing the ground surface of the silicon substrate.

20 Claims, 20 Drawing Sheets

U.S. PATENT DOCUMENTS

| | | | |
|---|---|---|---|
| 5,382,537 A | | 1/1995 | Noguchi |
| 5,786,242 A * | | 7/1998 | Takemura et al. ........... 438/166 |
| 6,451,671 B1 | | 9/2002 | Yamada |
| 6,682,963 B2 | | 1/2004 | Ishikawa |
| 7,105,423 B2 | | 9/2006 | Yamano et al. |
| 7,109,071 B2 | | 9/2006 | Ishikawa |
| 7,276,429 B2 | | 10/2007 | Yamanaka |
| 7,303,942 B2 * | | 12/2007 | Kuwabara et al. ........... 438/113 |
| 7,405,132 B2 * | | 7/2008 | Arao et al. .................. 438/393 |
| 7,439,193 B2 * | | 10/2008 | Li et al. ...................... 438/780 |
| 2002/0027247 A1 * | | 3/2002 | Arao et al. .................. 257/347 |
| 2004/0023447 A1 * | | 2/2004 | Hirakata et al. ............. 438/149 |
| 2004/0144983 A1 * | | 7/2004 | Arao et al. ................... 257/72 |
| 2004/0164302 A1 | | 8/2004 | Arai et al. |
| 2005/0023525 A1 | | 2/2005 | Ishikawa |
| 2005/0062065 A1 * | | 3/2005 | Hirakata et al. ............. 257/200 |
| 2006/0071215 A1 * | | 4/2006 | Arao et al. ................... 257/72 |
| 2006/0270175 A1 * | | 11/2006 | Aoki et al. .................. 438/381 |
| 2007/0031990 A1 * | | 2/2007 | Maekawa .................... 438/99 |
| 2008/0237591 A1 * | | 10/2008 | Leedy ......................... 257/48 |
| 2008/0251941 A1 * | | 10/2008 | Leedy ....................... 257/777 |
| 2008/0254572 A1 * | | 10/2008 | Leedy ......................... 438/109 |
| 2008/0277660 A1 * | | 11/2008 | Tsurume et al. ............... 257/48 |
| 2008/0284611 A1 * | | 11/2008 | Leedy ..................... 340/815.4 |
| 2009/0194768 A1 * | | 8/2009 | Leedy ......................... 257/48 |

FOREIGN PATENT DOCUMENTS

| | | |
|---|---|---|
| JP | 03-087299 | 4/1991 |
| JP | 11-020360 | 1/1999 |
| JP | 11-212116 | 8/1999 |
| JP | 2002-164354 | 6/2002 |
| JP | 2004-094492 | 3/2004 |
| JP | 2004-282050 | 10/2004 |

OTHER PUBLICATIONS

Usami et al., "17.1 An SOI-Based 7.5 μm-Thick 0.15×0.15mm$^2$ RFID Chip," ISSCC 2006 (Digest of Technical Papers, IEEE International Solid-State Circuits Conference), pp. 308-309 and 655.

Kouvatsos, Electronics Letters, vol. 32, No. 8, pp. 775-776, Apr. 11, 1996.

Reeiche, Advanced Packing, Mar. 2003, pp. 1-8.

* cited by examiner

SEMICONDUCTOR DEVICE HAVING A FIRST BASE, A THIN FILM TRANSISTOR, AND A SECOND BASE

BACKGROUND OF THE INVENTION

1. Field of the Invention

The present invention relates to a manufacturing method of a semiconductor device including a flexible thin film integrated circuit having a memory, a microprocessor (central processing unit, a CPU), or the like with a thin thickness like paper. The present invention further relates to a manufacturing method of a non-contact type thin film integrated circuit device including the thin film integrated circuit and an antenna, which is used for a card, a tag, a label, or the like to distinguish human, animals and plants, products, paper money, or the like mainly.

2. Description of the Related Art

In recent years, development of a semiconductor device which can transmit/receive data is actively advanced, and such a semiconductor device is called as an IC chip, an RF tag, a wireless tag, an electronic tag, a wireless processor, a wireless memory, or the like. Most semiconductor devices, which have been already put into practical use, are formed with single crystalline silicon substrates (hereinafter, referred to as IC chips in some case). Such semiconductor devices are frequently used in a product form such as a sheet type and a card type, and thus, required to be thin and flexible. Thus, a semiconductor element is thinned by grinding and polishing a backside of a base material.

Generally, the backside polish of a single crystalline silicon substrate including an integrated circuit is accomplished by final polishing with a loose grain after grinding with a whetstone, which is sometimes carried out in combination with etching with acid or alkal. The final thickness of the base material is required to be 100 μm or less to obtain a mirror-polished state, and a thickness of 500 μm or less is required for obtaining a sufficient flexibility. Development of thinner products become possible by polishing a semiconductor element thinner, and production technique is competed.

The element thinned by grinding and polishing is connected to an external antenna and sealed with a film or resin so that products such as a card and tag are manufactured. A built-in antenna type in which an antenna is formed directly over an element is sealed with a film or resin, and various products can be manufactured. In this manner, an IC chip can be used in various ways without limitation on its application, by making its final state thin and flexible.

The step of polishing the conventional IC card is described in the Patent Document 1 below.

It is possible to manufacture a thin semiconductor element by grinding and polishing a base material in order to obtain a non-single crystalline silicon thin film transistor circuit which is manufactured over an insulating substrate such as a glass substrate, in addition to an integrated circuit over a single crystalline silicon substrate. The non-single crystalline silicon thin film transistor can be formed over a large and inexpensive glass substrate, and manufacturing cost can be reduced considerably compared with a semiconductor element using a single crystalline silicon wafer.

[Patent Document 1] Japanese Patent Laid-Open No. Hei3-87299

However, there are various restrictions on the shape, step, or the like in the case of manufacturing a thin element using a glass substrate as a base material. As a glass substrate used as a base material, a non-polished substrate manufactured by a fusion method is generally used in order to reduce a manufacturing cost. Polishing is necessary for a glass substrate manufactured by a float process; however, only one side is polished for reducing cost. Thus, since there is variation in a thickness in the range from several μm to several ten μm on one or both sides of a glass substrate, variation in the thickness of a substrate surface is generated in thinning process of 100 μm or less with polishing. Thus, yield of the element is lowered.

On the other hand, variation in a substrate thickness is less likely to be generated if a substrate of which both surfaces are polished is used. However, it is difficult to prepare a large apparatus in accordance with a large glass substrate or to polish a large substrate uniformly. Thus, there is a problem such that cost reduction in a step using a small single crystalline silicon substrate or a quartz substrate cannot be achieved.

In the same manner, even if a small substrate of which both surfaces are polished is used, the number of products manufactured per unit area reduces. Thus, cost tends to increase. In addition, a substrate having corners is unsuitable for a grinding and polishing apparatus having a rotational friction structure, and there is a problem such that a corner defect and crack is easily produced. Therefore, a round substrate having an excellent symmetric as a single crystalline substrate is preferable for a rotational friction structure; however, cost tends to increase when a glass substrate is processed into a round shape.

Therefore, it is very difficult to manufacture a non-single crystalline silicon thin film transistor element over a glass substrate having a thickness of 100 μm or less at low cost and high yield. Thus, development of a product with a thin element using an inexpensive glass substrate as a base material cannot be carried out, and a thin element using an expensive single crystalline silicon substrate as a base material is used for a product at present. As a result, expansion of markets is suppressed.

In the case where a glass substrate is used, since its melting point is a rate-controlling point, it is generally manufactured with a low temperature process of 600° C. or less. For example, the temperature is limited for a field effect polysilicon thin film transistor manufactured with a glass substrate, in a process of crystallization and activation of a polysilicon layer to be an active layer and in a process where a high temperature is advantageous for forming a gate oxide film, or the like. Thus, there has been a problem such that electric properties are deteriorated compared with a field effect transistor manufactured with a single crystalline silicon substrate or a quartz substrate.

SUMMARY OF THE INVENTION

The present invention is made in the view of forgoing. An object of the present invention is to provide a thin film integrated circuit at low cost and with extremely thin thickness, which is applicable to mass production, unlike the conventional glass substrate or the single crystalline silicon substrate. It is another object of the present invention to provide a structure and a process of a thin film integrated circuit device or an IC chip having the thin film integrated circuit.

The present invention relates to a semiconductor device having a non-single crystalline silicon thin film transistor, which is formed over a semiconductor substrate having high heat resistance and high flatness with an insulating film interposed therebetween, and a manufacturing method thereof. The semiconductor substrate is made with a single crystalline or polycrystalline material. In the present invention, the semiconductor substrate is electrically insulated from a semiconductor region of a non-single crystalline silicon thin film transistor with the use of an insulating film interposed therebetween. The phase state and electric properties of the semiconductor substrate material are not identical with those of the semiconductor region of a non-single crystalline silicon thin film transistor.

One feature of the present invention is a manufacturing method of a semiconductor device including the steps of: forming a first insulating film over one surface of a silicon substrate; forming a layer having a thin film integrated circuit over the first insulating film; forming a resin layer so as to cover the layer having the thin film integrated circuit; forming a film so as to cover the resin layer; grinding a backside of the silicon substrate, one surface of which is formed with the layer having the thin film integrated circuit, and polishing the ground surface of the silicon substrate.

One feature of the present invention is a manufacturing method of a semiconductor device including the steps of: forming a first insulating film over one surface of a silicon substrate; forming a layer having at least two thin film integrated circuits over the first insulating film; forming a resin layer so as to cover the layer having the thin film integrated circuits; forming a film so as to cover the resin layer; grinding a backside of the silicon substrate, one surface of which is formed with the layer having the thin film integrated circuit; polishing the ground surface of the silicon substrate; cutting off the silicon substrate, the first insulating film, the layer having the thin film integrated circuit, and the resin layer without cutting off the film; forming at least two stacks of the silicon substrate, the first insulating film, the layer having the thin film integrated circuits, and the resin layer; stretching the film so as to form a gap between the stacks; separating the stacks from the film; adhering one surface of the stacks to a first base, and adhering the other surface of the stacks to a second base.

One feature of the present invention is a manufacturing method of a semiconductor device including the steps of: in a step of separating a stack from a film, irradiating a film with light; taking out the stack over the film by a pickup means (such as a robot arm, a delivery device, and tweezers); providing the stack over a first base by the pickup means for adhering one surface of the stack to the first base.

One feature of the present invention is a manufacturing method of a semiconductor device including the steps of: in a step of separating a stack from a film and adhering one surface of the stack to a first base, irradiating the film with light; providing the first base so as to cover one surface of the stack; adhering one surface of the stack to the first base by heating the first base, and separating the first base adhered the stack from the film.

One feature of the present invention is a manufacturing method of a semiconductor device including the steps of: forming a first insulating film over one surface of a silicon substrate; forming a layer having at least two thin film integrated circuits including a second insulating film and a third insulating film over the first insulating film; providing a film so as to cover the layer having the thin film integrated circuit; grinding a backside of the silicon substrate, one surface of which is formed with the layer having the thin film integrated circuit; polishing the ground surface of the silicon substrate; cutting off the silicon substrate, the first insulating film, the second insulating film and the third insulating film included in the thin film integrated circuit without cutting off the film; forming at least two stacks of the silicon substrate, the first insulating film, and the layer having the thin film integrated circuit; stretching the film so as to form a gap between the stacks; separating the stack from the film; adhering one surface of the stack to a first base, and adhering the other surface of the stack to a second base.

One feature of the present invention is that the thickness of the silicon substrate is 100 µm or less when grinding the backside of the silicon substrate, one surface of which is formed with the layer having the thin film integrated circuit.

One feature of the present invention is that the thickness of the silicon substrate is not less than 1 µm and not more than 20 µm when the ground surface of the silicon substrate is polished.

One feature of the present invention is a semiconductor device including: a first base, a second base, a silicon substrate, an insulating film formed over the silicon substrate, a thin film integrated circuit provided over the insulating film, and a resin layer covering the thin film integrated circuit. The first base is touched with the substrate, the second base is touched with the resin layer, and the thickness of the substrate is not less than 1 µm and not more than 20 µm.

One feature of the present invention is that the resin layer is a film.

One feature of the present invention is a semiconductor device including: a first base, a second base, a silicon substrate, an insulating film formed over the silicon substrate, and a thin film integrated circuit provided over the insulating film. The first base is touched with the silicon substrate; the second base is touched with the thin film integrated circuit, and the thickness of the substrate is not less than 1 µm and not more than 20 µm.

One feature of the present invention is that the silicon substrate is a polycrystalline silicon substrate.

One feature of the present invention is that the silicon substrate is a single crystalline silicon substrate.

One feature of the present invention is that the semiconductor, device of the present invention is an IC chip.

In other words, the semiconductor substrate and a non-single crystalline silicon layer are not identical, and provided in a stacked state over a base material. That is to say, electric properties of the non-single crystalline silicon thin film transistor have no dependency on the difference in the phase state and electric properties of the semiconductor substrate, and the semiconductor substrate is positioned as only a support medium of the stacked device.

Over either an insulating or conductive substrate used as the support medium, a non-single crystalline silicon thin film transistor can be formed. However, electric waves are reflected if a conductive material is used for the substrate. In addition, a directionality of usage is limited when using an IC chip for an RF tag for converting electric waves into electric power. While an insulating substrate does not have such a problem, it has a problem in that static electricity tends to be generated. Thus, reliability of an element is deteriorated due to electrostatic breakdown. Therefore, a so-called semiconductor is preferable for the substrate used as a base material in a view of electric resistance.

As the semiconductor substrate, a silicon material is preferably used, and especially a polycrystalline substrate is effective in terms of an inexpensive cost. The polycrystalline material is mainly used for a solar battery or the like. On the other hand, the material is not suitable for forming an integrated circuit directly since crystal orientation is varied in a plane or defective crystals or crystal grain boundaries exist. An equivalent degree of flatness to that of a single crystalline substrate can be obtained by polishing a plane face, and a thin element can be manufactured by grinding and polishing, in a similar way to the element manufactured over the single crystalline substrate.

A single crystalline substrate can also be used, besides a polycrystalline substrate. Note that a single crystalline silicon substrate used for a manufacturing step of an integrated circuit is expensive, and thus the cost of the substrate becomes high if the single crystalline silicon substrate is used as a support medium. The single crystalline substrate to be used is limited to the one which has a possibility of being a defective piece if used in a manufacturing step of an integrated circuit, such as problems in value of resistance, amount of impurities, number of dust, scratches on the backside, or generation of defective crystals. Such a single crystalline substrate is a substandard article for a manufacturer of a substrate, and supplied inexpensively as a dummy wafer for checking a step. In addition, a polished product of a polycrystalline substrate or a single crystalline substrate of a substandard article is limited to 8-inch φ or 12-inch φ in its size; however, they are substantially more inexpensive than a polished glass substrate with the same size. Thus, cost reduction is achieved.

Further, a process of high temperature around 100° C. can be used with a silicon material whose melting point is 1410° C., which is impossible with a glass substrate. Due to the process of high temperature, increase in the crystal grain size of an active layer or formation of a gate oxide film by thermal oxidation becomes possible with a polysilicon thin film transistor, and an element showing electric properties which is equivalent to or better than a quartz substrate, and secondary to a single crystalline silicon substrate can be obtained.

Grinding and polishing are used for making a non-single crystalline thin film transistor element manufactured over such a semiconductor substrate into a thin element such as an IC chip. An edge defect or a crack is easily generated in a square glass substrate; however, the problems are reduced in a round polycrystalline substrate or a single crystalline substrate, and yield is increased.

Moreover, a silicon material has high toughness than a glass material, and thus, the silicon material is suitable for being polished thinner. In particular, a polycrystalline substrate has intensity without a breaking in a manner cutting the substrate vertically, which is seen in a single crystalline substrate. In addition, the polished silicon material with a high degree of flatness has a variation within submicron in its plain, and can be polished thinner with high yield. This point is different from a non-polished glass substrate.

In this manner, a thin film transistor over a silicon material manufactured by the present invention increases its electric properties since it can employ a process of high temperature with low-cost materials. In addition, an element having high electrostatic breakdown voltage can be manufactured since its base material is not insulating. Moreover, it is easy to make the silicon material thinner, for example with a thickness of 100 um or less, unlike a glass substrate, and it is possible to manufacture a thin element having high intensity even if the thickness of the element is 20 μm or less. Thus, an IC chip with high yield can be manufactured. As a result, an IC chip which is thin and has a wide application can be supplied at low cost.

DETAILED DESCRIPTION OF THE INVENTION

Figure 1A:
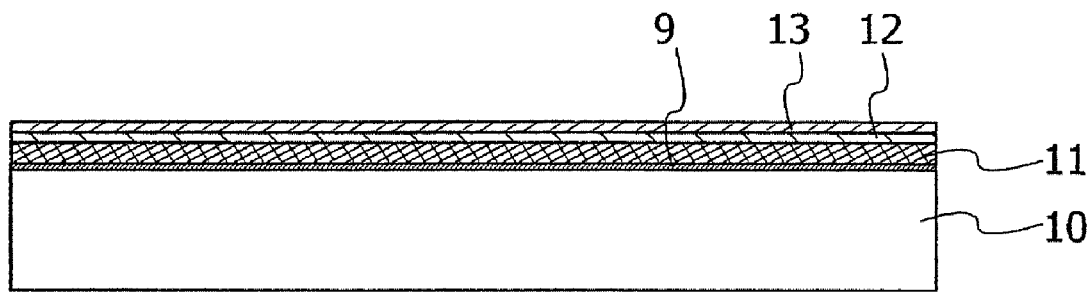
FIGS. 1A to 1D are views illustrating a manufacturing method of an IC chip of the present invention (Embodiment Mode 1)

Although the present invention will be fully described by way of embodiment modes with reference to the accompanying drawings, it is to be understood that various changes and modifications will be apparent to those skilled in the art. Therefore, unless otherwise such changes and modifications depart from the scope of the present invention, they should be construed as being included therein. In a structure of the present invention described below, reference numerals indicating the same portion may be used in different drawings in common. Moreover, each of the embodiment modes can freely combined.

Embodiment Mode 1

A thin film integrated circuit device and a manufacturing method thereof using the present invention are described with reference to accompanying FIGS. 1A to 3C. First of all, a substrate 10 made with a silicon wafer is prepared as a support substrate, and a first insulating film 9 is formed by heat treatment or a film forming method (refer to FIG. 1A), for example, a high-density plasma treatment apparatus, a sputtering apparatus, a plasma CVD apparatus, a vacuum pressure CVD apparatus, or the like. Note that it is preferable that the surface of a silicon substrate be directly processed with a high-density plasma treatment apparatus. The first insulating film 9 is formed with an oxide film, a nitride film, or an oxynitride film of silicon. Note that a polycrystalline silicon substrate whose surface is mirror-polished or a single crystalline substrate is preferably used for the silicon wafer serving as the support substrate. Herein, in the case of using the single crystalline substrate, a substandard article can be used, which generates troubles such as a problem in value of resistance, amount of impurities, or dust, scratches on the backside, and generation of defective crystals in a manufacturing process of an integrated circuit.

The high-density plasma treatment apparatus used for forming the first insulating film 9 is a treatment apparatus using high-density plasma whish is excited by microwave, whose electron temperature is 1.5 eV or less (preferably 0.5 to 1.5 eV), whose ion energy is 5 eV or less, and whose electron density is approximately $1.0 \times 10^{11}$ cm$^{-3}$ to $1.0 \times 10^{13}$ cm$^{-3}$. A plasma treatment apparatus of microwave excitation using a radial slot antenna can be used for generating plasma. At this time, the surface of the silicon substrate can be nitrided by introducing a mixed gas of a rare gas and a nitrogen source gas such as nitrogen ($N_2$), ammonia ($NH_3$), and nitrogen monoxide ($N_2O$). Moreover, an oxide film can be formed on the surface of the silicon substrate by introducing a mixed gas of oxygen ($O_2$), hydrogen ($H_2$), and a rare gas. Here, an argon (Ar) is used as a rare gas. By using the high-density plasma treatment apparatus, a dense film can be manufactured with little plasma damage. Alternatively, plasma oxidation treatment can be performed sufficiently by plasma treatment at low temperature treatment (typically 250 to 550° C.). Note that microwave (2.45 GHz) is used as frequency for generating plasma. Further, a low plasma electric potential of 5 V or less can prevent excess dissociation of molecules.

The nitride film formed in the step includes the rare gas used in the high-density plasma treatment. Here, an argon gas is included since an argon gas is used.

Next, a layer 11 having a plurality of thin film integrated circuits is formed over one surface of the substrate 10 which is formed with the first insulating film 9 (refer to FIG. 1A). The layer 11 having a plurality of thin film integrated circuits includes at least an insulating film, a semiconductor layer and a conductive layer making up a plurality of elements. Further, the layer 11 includes a conductive layer serving an antenna in the case of incorporating an antenna function. Specifically, the layer 11 includes a plurality of elements provided over the first insulating film formed over the wafer functioning as a base film, a second insulating film covering the plurality of elements, a first conductive layer touched with the second insulating film and connected to the plurality of elements, and a third insulating film covering the first conductive layer, and in the case of incorporating the antenna, a second conductive layer functioning as an antenna and touched with the third insulating film, and a fourth insulating film covering the second conductive layer. The more detailed structure will be described in Embodiment Mode 4. Note that a structure where an antenna function is not incorporated and the antenna is attached later will be described in Embodiment Mode 5. Note that the term "plurality" in this specification means at least two.

Next, a first film or a resin layer 12 is provided so as to cover the layer 11 having a plurality of thin film integrated circuits. The first film or the resin layer 12 is provided in order to protect the layer 11 having a plurality of thin film integrated circuits.

Next, a second film 13 is provided so as to cover the first film or the resin layer 12. The second film 13 is formed with a vinyl chloride resin, a silicone resin, a polyolefin resin, or the like, and has a stretching property. Thus, the second film 13 is called as an expanded film in some cases. In addition, the second film 13 preferably has such a property that it has a strong adherence in a normal state but has a weak adherence when irradiated with light. Specifically, a UV tape may be used, which is to be weak in its adherence when irradiated with ultraviolet light.

Figure 1B:
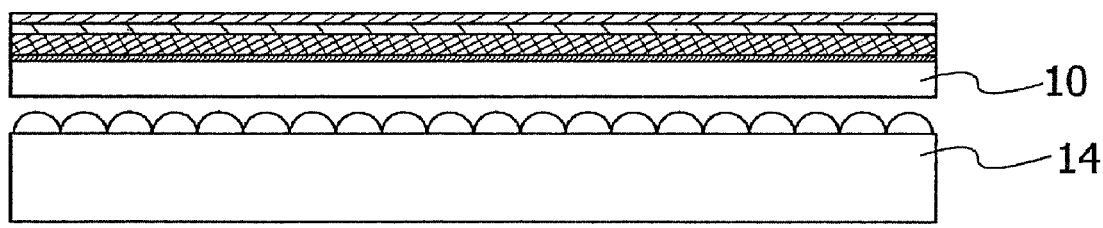

Next, the opposite surface of the substrate 10 is ground by a grinding means 14 (refer to FIG. 1B). According to this grinding, the substrate 10 is roughly thinned. The substrate 10 is preferably ground to have a thickness of 100 μm or less. In general, by revolving one or both of a jig to which the substrate 10 is fixed and the grinding means 14, the surface of the substrate 10 is ground in the grinding step. The grinding means 14 corresponds to a whetstone, for example.

Figure 1C:
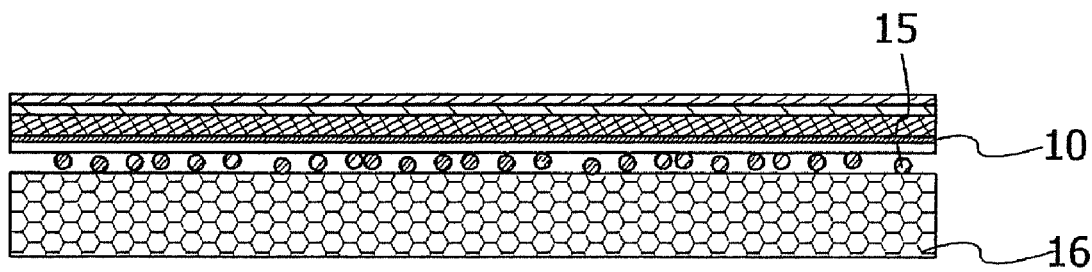

Next, the surface of the ground substrate 10 is polished by a polishing means 16 (refer to FIG. 1C). According to this polishing, the asperity of the ground substrate 10 is removed, and the ground substrate 10 is further thinned. The substrate 10 is preferably polished to have a thickness of 1 to 20 μm, or more preferably 1 to 5 μm. In the same manner as the above grinding step, the surface of the substrate 10 is polished by revolving one or both of the jig to which the substrate 10 is fixed and the polishing means 16 in the polishing steps. The polishing means 16 corresponds to an abrasive cloth, for example. Further, a loose grain 15 may also be used besides the abrasive cloth. The loose grain used in the present embodiment mode may be approximately 1 μm in diameter. After that, cleaning is conducted, if necessary, in order to remove dust produced in grinding and polishing steps, which is not shown in the drawing.

Subsequently, the substrate 10, the first insulating film 9, the layer 11 having a plurality of thin film integrated circuits, and the first film or the resin layer 12 are cut off by a cutoff means 17. In the layer 11 having a plurality of thin film integrated circuits, the boundaries among the thin film integrated circuits (between the thin film integrated circuits) are cut off so as to separate each of the plurality of thin film integrated circuits. Further, the insulating film provided in the layer 11 having the plurality of thin film integrated circuits is cut off without cutting off elements provided in the layer 11 having the plurality of thin film integrated circuits. Therefore, a plurality of thin film integrated circuits 18 is formed after the cutoff step.

Figure 1D:
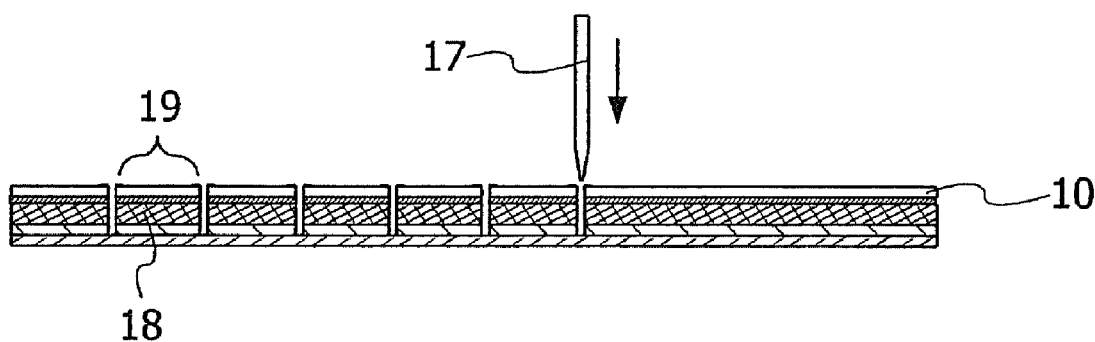

A plurality of IC chips 19 is formed as a stack of the substrate 10, the first insulating film 9, the thin film integrated circuits 18, and the first film or the resin layer 12 (refer to FIG. 1D). Note that the cutoff means 17 corresponds to a dicer, a laser, a wire saw, or the like. Moreover, the second film 13 is not cut off in this step. Any kinds of laser may be used for cutting, as long as it can conduct a cut-off process.

Figure 2A:
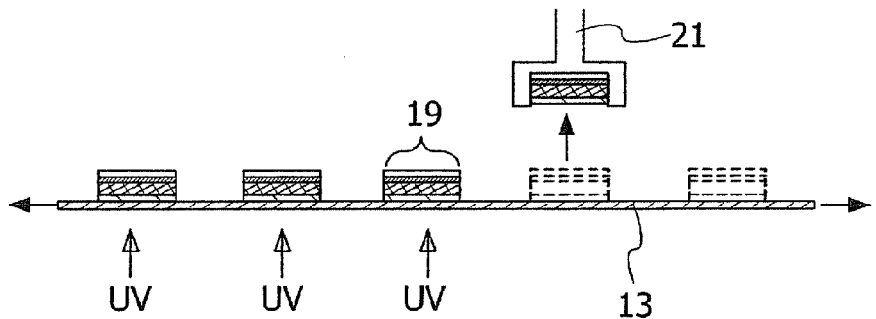
FIGS. 2A to 2C are views illustrating a manufacturing method of an IC chip of the present invention (Embodiment Mode 1)

The second film 13 is stretched so as to form a gap between the IC chips 19 (refer to FIG. 2A). At this time, it is preferable to stretch in a plane direction equally so as to make the gaps between the IC chips 19 equally. Subsequently, the second film 13 is irradiated with light. In the case where the second film 13 is a UV tape, the film is irradiated with ultraviolet light. Thus, the adherence of the second film 13 is weakened and the adhesiveness between the second film 13 and the IC chip 19 is lowered. Then, such a state is obtained that the IC chip 19 can be separated from the second film 13 by a physical method.

The second film 13 is irradiated with light after stretching the second film 13 in the above step; however, the present invention is not limited to this order. The second film 13 may be stretched after the second film 13 is irradiated with light.

The subsequent step can be carried out with either of the following two kinds of methods, and the first method is described below, at first.

In the first method, the IC chip 19 is taken out by a pick up means 21 so as to separate the IC chip 19 from the second film 13. Next, the IC chip 19 is set over a first base 20 by the pick up means 21 so as to adhere one surface of the IC chip 19 to the first base 20 (refer to FIG. 2B).

Figure 2B:
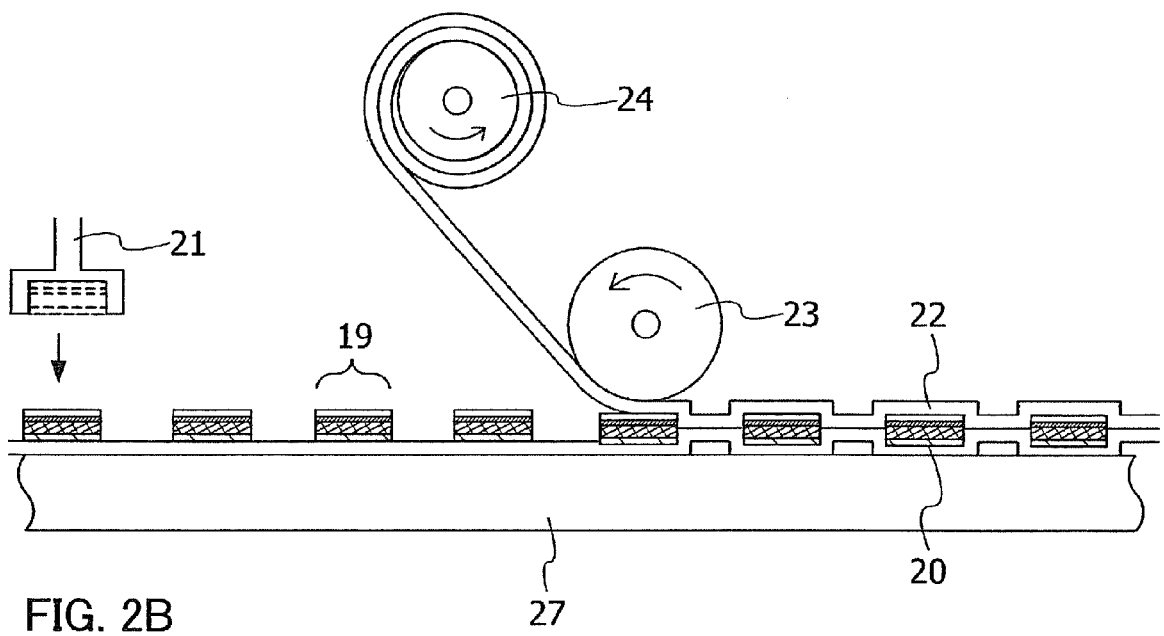

Subsequently, the other surface of the IC chip 19 is adhered to a second base 22 (refer to FIG. 2B). The step is carried out with a laminator, and the laminator includes a supply roll 24 having the second base 22 twined and a roll 23 having a base twined, which is provided with an adhesive layer containing a thermosetting resin or a thermoplastic resin as a main component on a base portion of a flexible sheet or film having one or both of a heating function and a pressuring function. By revolving the roll 23 and the supply roll 24 in order, thermocompression and sealing treatment are continuously conducted to the IC chip 19 with the base provided with the adhesive layer containing the thermosetting resin or the thermoplastic resin as a main component at the base portion of the sheet or film having a flexible property. Specifically, the other face of the IC chip 19 is adhered to the second base 22 with the roll 23, and the IC chip 19 is sealed with the first base and the second base 22, by conducting one or both of the heat treatment and pressure treatment.

Here, the above thermocompression and sealing treatment are described more in detailed. The roll 23 and the supply roll 24 are revolved in order, and the supply roll 24 supplies the second base 22 to the roll 23. The first base 20 provided with the plurality of IC chips 19 are transferred in order by a transporting means 27. The thermocompression and sealing treatment corresponds to the treatment in which one or both of the pressure treatment and heat treatment is/are conducted onto the IC chip 19, the first base 20, and the second base 22 by the roll 23 and the transporting means 27 when the first base 20 to which the IC chip 19 is adhered passes between the roll 23 and the transporting means 27. As the thermocompression and sealing treatment are conducted, the IC chip 19 is sealed with the first base 20 and the second base 22. Note that the transporting means 27 corresponds to a belt conveyer, or a plurality of rollers or robot arms, or the like. When heat treatment is conducted with the roll 23 and the transporting means 27, the roll 23 has a heat function corresponding to a heater of a heating wire, oil or the like.

Figure 2C:
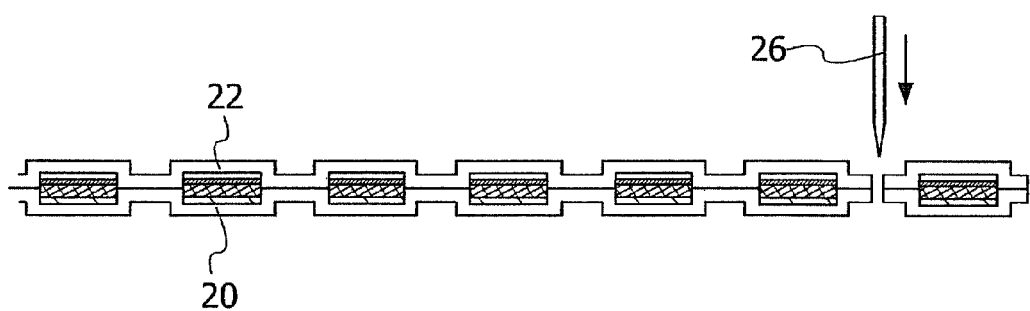

Subsequently, the first base 20 and the second base 22 are cut off by a cutoff means 26 (refer to FIG. 2C). Then, the IC chip 19 sealed with the first base 20 and the second base 22 is completed.

Next, the second method is described.

Figure 3A:
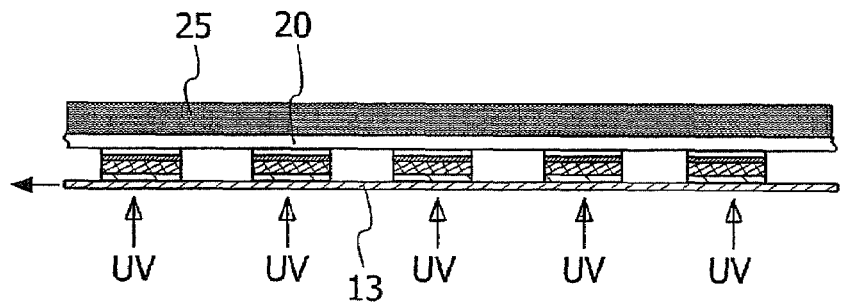
FIGS. 3A to 3C are views illustrating a manufacturing method of an IC chip of the present invention (Embodiment Mode 1)
Figure 3B:
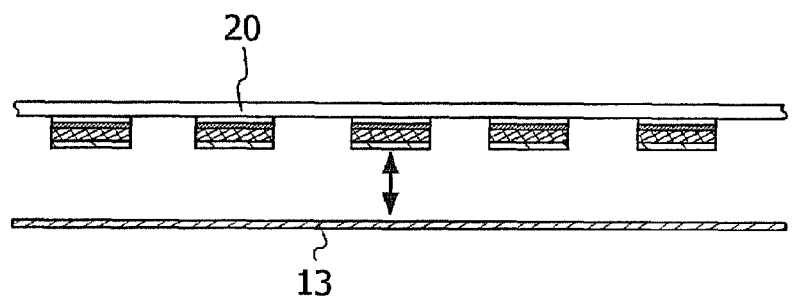

First, a first base 20 is provided so as to cover one surface of an IC chip 19 (refer to FIG. 3A). Next, one surface of the IC chip 19 is adhered to the first base 20 by heating the first base 20 with a heating means 25. Subsequently, the first base 20 to which the IC chip 19 is adhered is separated from the second film 13 so as to separate the IC chip 19 from the second film 13 (refer to FIG. 3B).

Figure 3C:
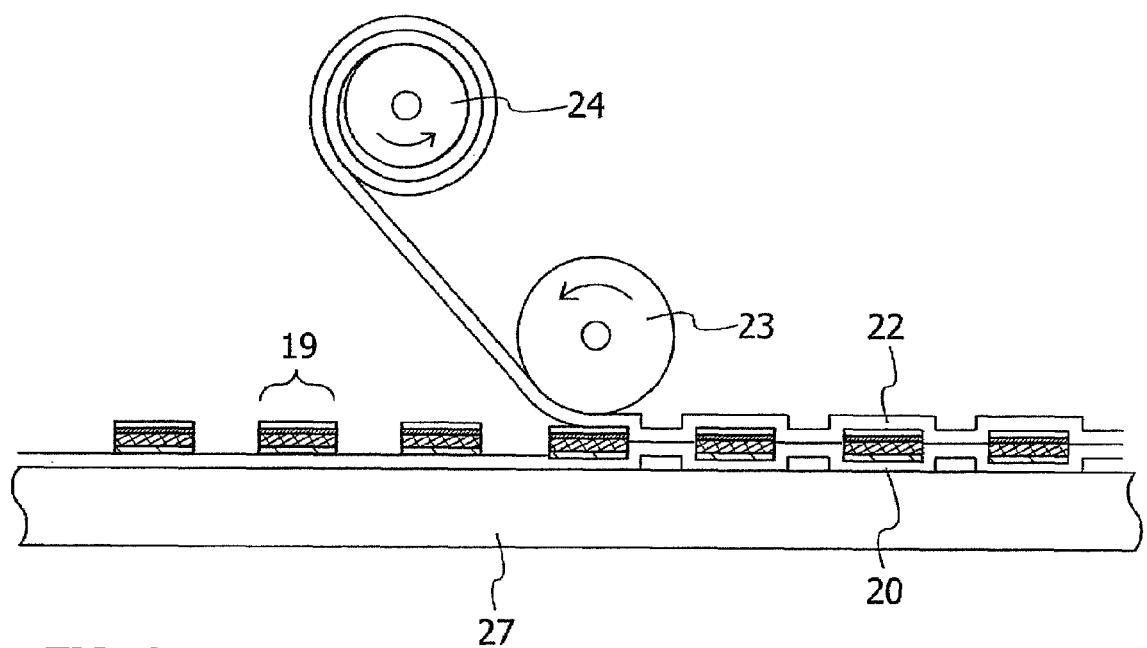

Subsequently, by adhering the other surface of the IC chip 19 to a second base 22, the IC chip 19 is sealed with the first base 20 and the second base 22 (refer to FIG. 3C). Then, the first base 20 and the second base 22 are cut off. In this step, a similar cutoff means to the one used in the first method (not shown) is used.

Note that the first base 20 is provided so as to cover one surface of the IC chip 19 after the second film 13 is irradiated with light, in the second method (refer to FIG. 3A). However, the present invention is not limited to this order, and the second film 13 may be irradiated with light after providing the first base 20 so as to cover one surface of the IC chip 19 and heating the first base 20.

In the above step, after completing the grinding step (refer to FIG. 1B) and the polishing step (refer to FIG. 1C) of the substrate 10, the cutoff step (refer to FIG. 1D) of the substrate 10 is performed; however, the present invention in not limited to this order. In other words, the grinding step and the polishing step of the substrate 10 may be performed, after the cutoff step of the substrate 10.

The IC chip 19 to be completed through the above step has a feature in its thin thickness and light weight. Further, the IC chip 19 has a feature that the design is not deteriorated due to its thin thickness even if the IC chip 19 is mounted on products.

Embodiment Mode 2

Embodiment Mode 2 of the present invention will be described referring to FIGS. 4A to 6B.

Figure 4A:
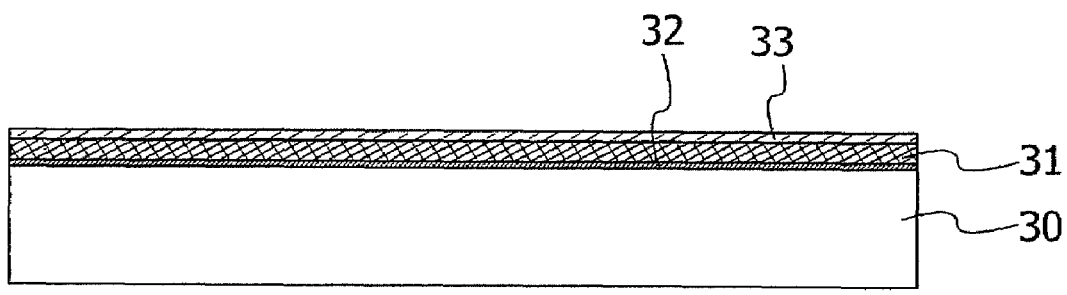
FIGS. 4A to 4D are views illustrating a manufacturing method of an IC chip of the present invention (Embodiment Mode 2)

First, an insulating film 32 is formed over one surface of a substrate 30, and a layer 31 having a plurality of thin film integrated circuits is formed over the insulating film 32 (refer to FIG. 4A). Note that the substrate 30 corresponds to a silicon wafer, for example a polycrystalline silicon substrate or a single crystalline substrate. The layer 31 having a plurality of thin film integrated circuits includes at least a plurality of insulating films, a semiconductor layer and a conductive layer making up a plurality of elements.

Next, a film 33 is provided so as to cover the layer 31 having a plurality of thin film integrated circuits. The film 33 is formed with a vinyl chloride resin, a silicone resin, a polyolefin resin, or the like, and a film having a stretching property is used. Thus, the film 33 is called as an expanded film in some cases. In addition, the film 33 preferably has such a property that it has a strong adherence in a normal state but has a weak adherence when irradiated with light. Specifically, a UV tape may be used, which is to be weak in its adherence when irradiated with ultraviolet light. Note that the present embodiment mode is different from Embodiment Mode 1 in that a protective film or a resin layer is not formed.

Figure 4B:
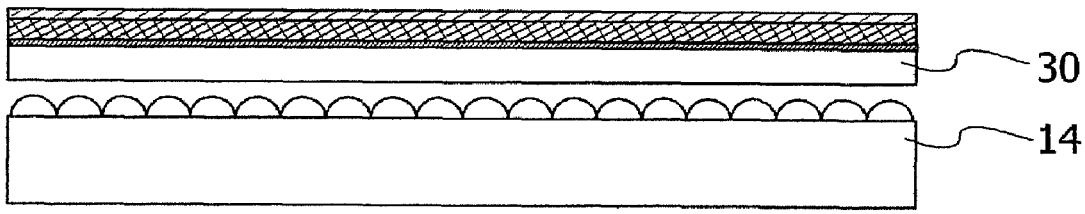

Next, the opposite surface of one surface of the substrate 30 which is formed with the insulating film 32 is ground by the grinding means 14 (refer to FIG. 4B). The substrate 30 is preferably ground to have a thickness of 100 µm or less.

Figure 4C:
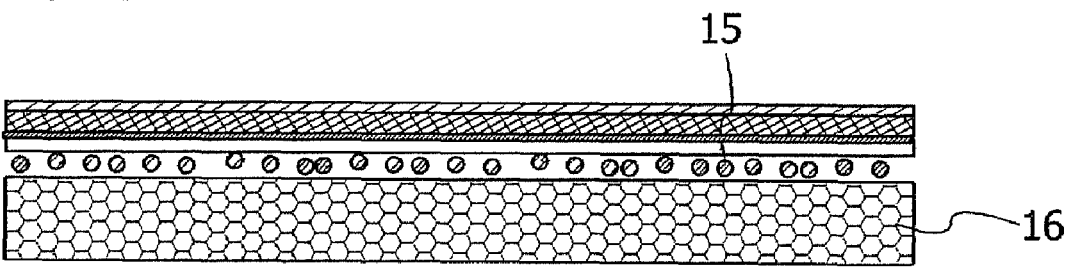
Figure 4D:
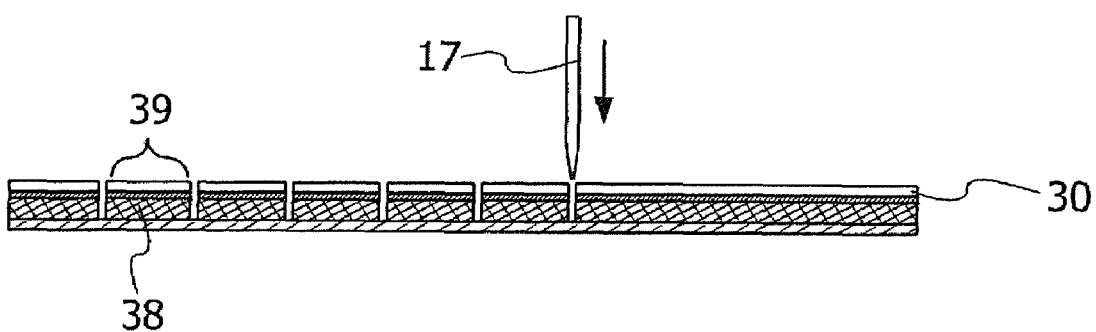

Next, the surface of the ground substrate 30 is polished by the polishing means 16 such as an abrasive cloth (refer to FIG. 4C). Further, the loose grain 15 may be used in this step. The loose grain used in the present embodiment mode may be approximately 1 µm in diameter. The substrate 30 is polished to have a thickness of preferably 1 to 20 µm, or more preferably 1 to 5 µm.

Subsequently, the substrate 30, the insulating film 32, and the layer 31 having a plurality of thin film integrated circuits are cut off by the cutoff means 17. In the layer 31 having a plurality of thin film integrated circuits, the boundaries of each thin film integrated circuit are cut off so as to separate each of the plurality of thin film integrated circuits. Moreover, the elements provided in the layer 31 having a plurality of thin film integrated circuits are not cut off; however, the insulating film provided in the layer 31 having a plurality of thin film integrated circuits is cut off. As a result, a plurality of thin film integrated circuits 38 is formed after the cutoff step. In other words, a plurality of IC chips 39 having a stack of the substrate 30, the insulating film 32, the thin film integrated circuit 38, and the film 33 is formed (refer to FIG. 4D). Note that the film 33 is not cut off in this step.

Figure 5A:
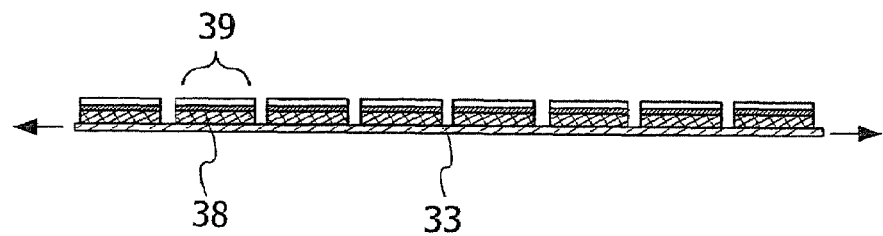
FIGS. 5A to 5D are views illustrating a manufacturing method of an IC chip of the present invention (Embodiment Mode 2)
Figure 5B:
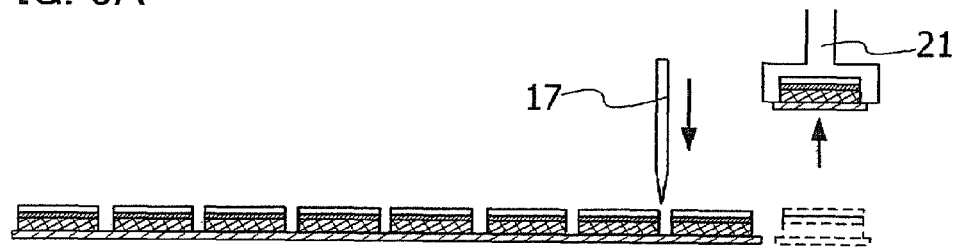
Figure 5C:
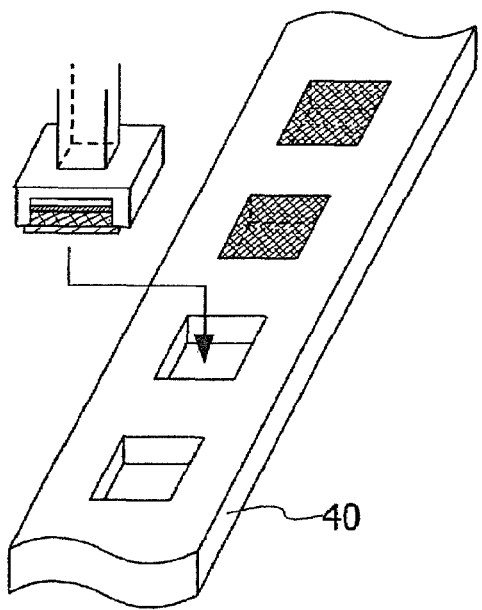

Subsequently, the film 33 is stretched so as to form gaps between the IC chips 39 (refer to FIG. 5A). At this time, the film is preferably stretched in a plane direction equally so as to make even gaps between the IC chips 39.

The subsequent step can be carried out with any one of the following three methods. As the first method, the case where the film 33 is an adhesive tape is described. In this case, the film 33 is cut off so as to separate the IC chips 39 by the cutoff means 17 (refer to FIG. 5B).

Subsequently, the IC chip 39 to which the film 33 is adhered is picked up by the pickup means 21. Then, by moving the pickup means 21, the IC chip 39 to which the film 33 is adhered is set in the concave portion of a first tape 40 (refer to FIG. 5C).

Figure 5D:
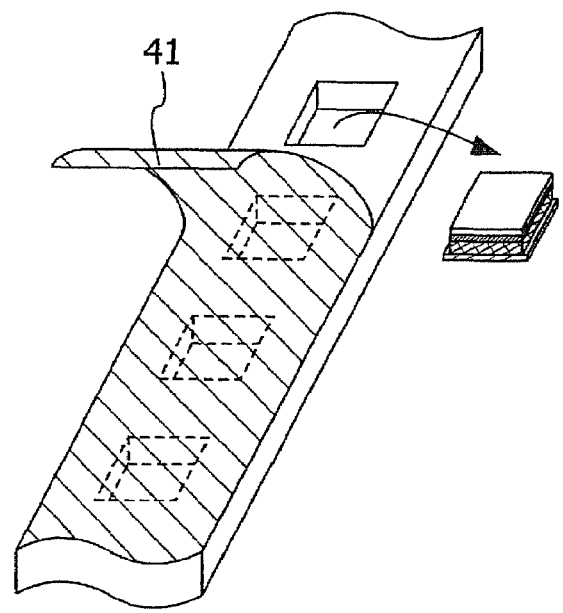
Figure 6A:
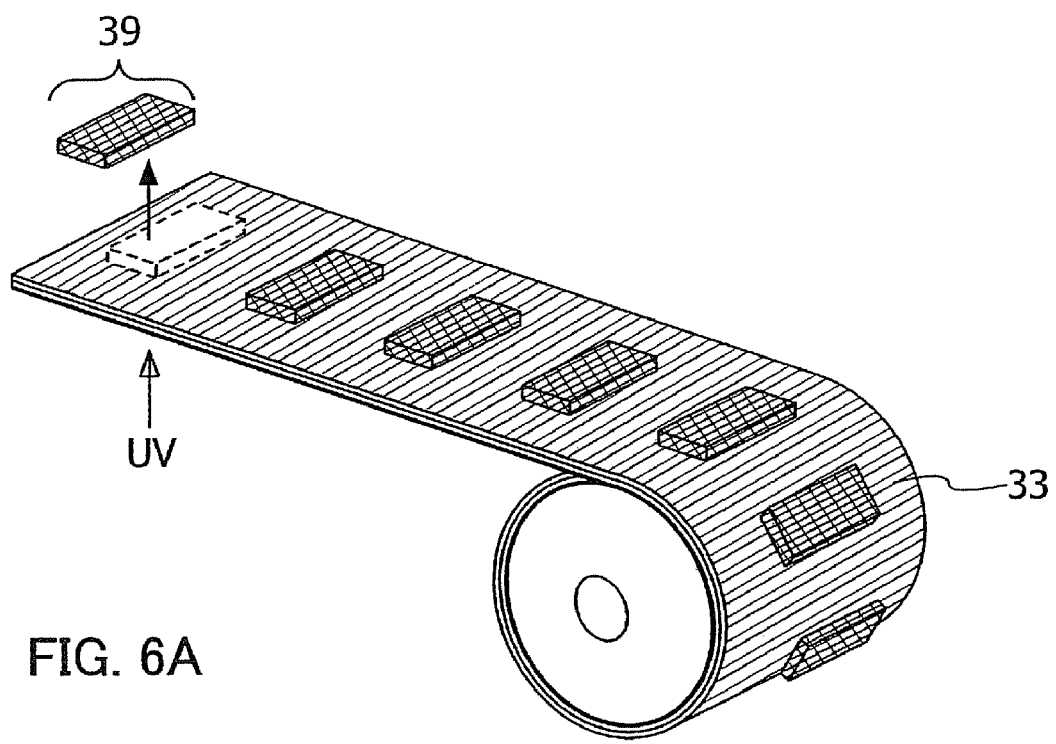
FIGS. 6A and 6B are views illustrating a manufacturing method of an IC chip of the present invention (Embodiment Mode 2)
Figure 6B:
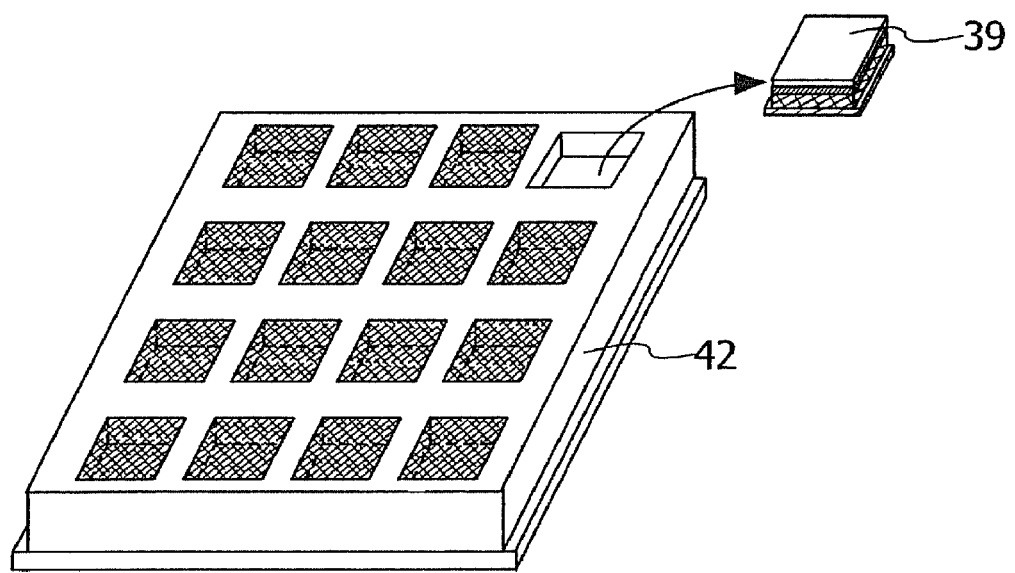
Figure 7A:
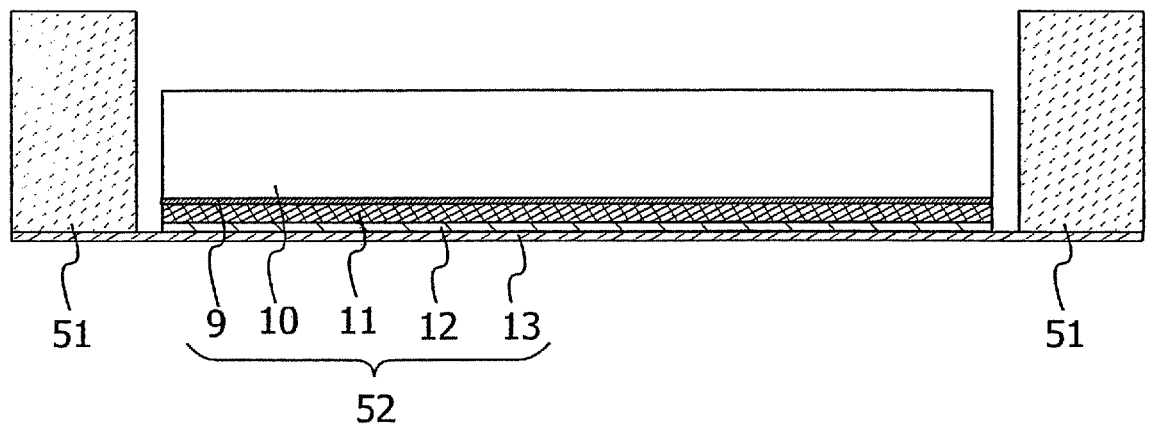
FIGS. 7A and 7B are views illustrating a manufacturing method of an IC chip of the present invention (Embodiment Mode 3)
Figure 7B:
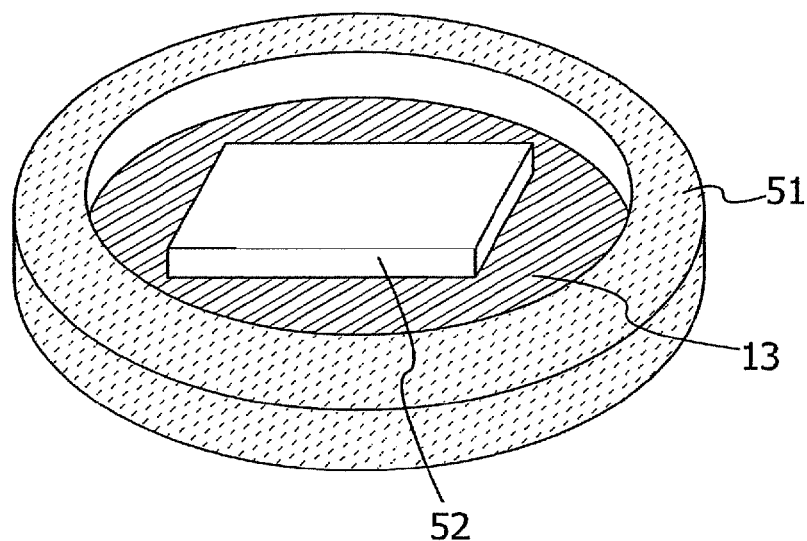
Figure 8A:
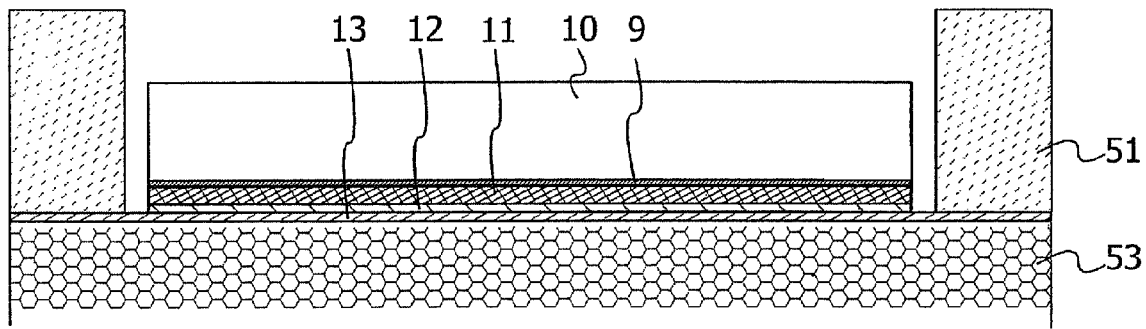
FIGS. 8A to 8C are views illustrating a manufacturing method of an IC chip of the present invention (Embodiment Mode 3)
Figure 8B:
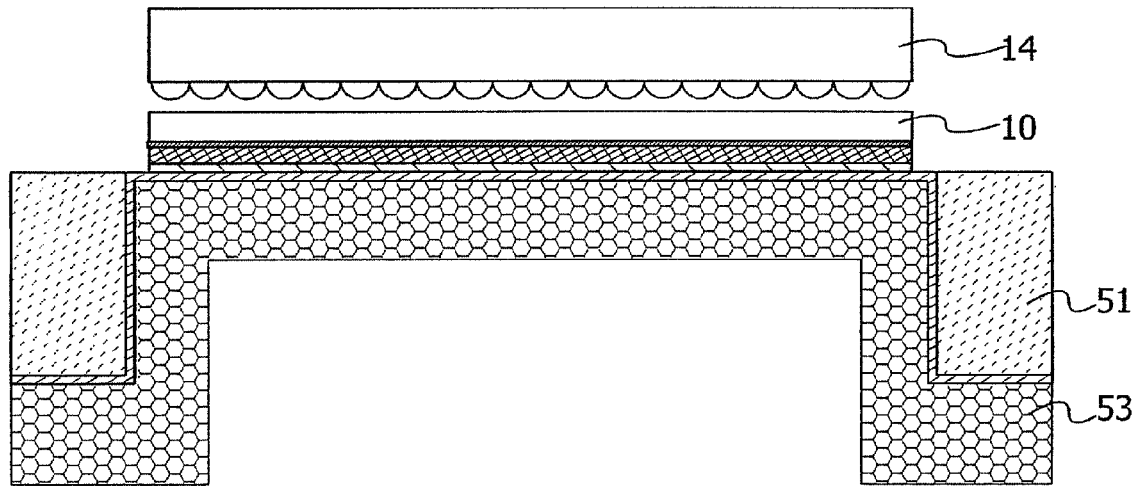
Figure 8C:
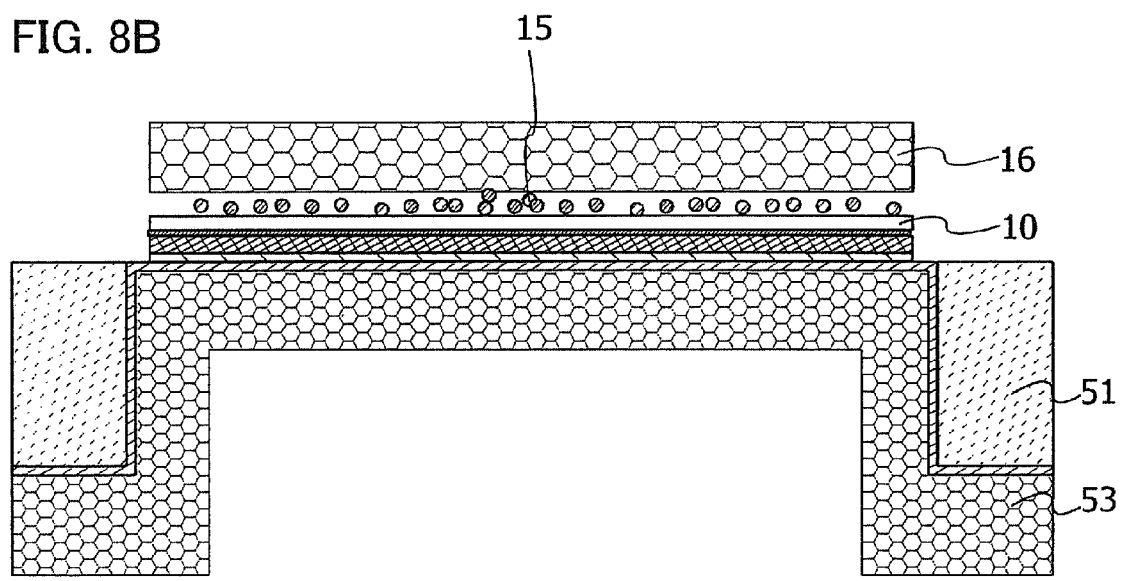
Figure 9:
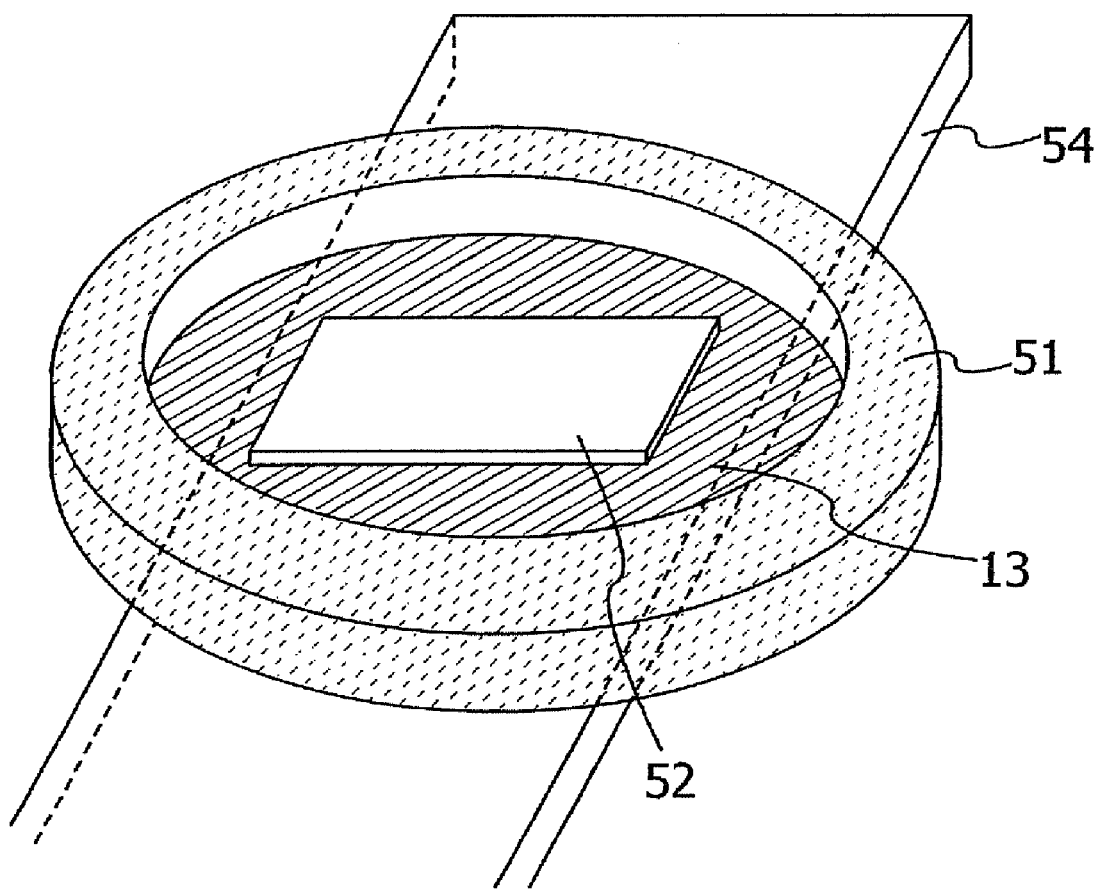
FIG. 9 is a view illustrating a manufacturing method of an IC chip of the present invention (Embodiment Mode 3)

Subsequently, a second tape 41 is provided to touch the first tape 40 (refer to FIG. 5D). When the IC chip 39 is used, the IC chip 39 is taken out by removing the second tape 41 from the first tape 40.

As the second method, the case where the film 33 is an UV tape is described. In this case, the film 33 can be shipped in a roll or a sheet state after stretching the film 33 (refer to FIG. 6A).

When the IC chip 39 is used, the film 33 is selectively irradiated with ultraviolet light. Then, adhesiveness between the film 33 and the IC chip 39 becomes low, and such a state can be obtained that the IC chip 39 can be separated from the film 33 by a physical method. Next, the IC chip 39 is completely separated from the film 33 to be used, by a separating means such as a pickup means.

Lastly, the case where the step after picking up the IC chip is not sealed is described. In this method, the IC chip is rearranged in a lattice-shaped over a tray 42 after picking up the IC chip (refer to FIG. 6B). Then, the IC chip may be taken out from the tray 42 when the IC chip is used.

Note that after completing the grinding step (refer to FIG. 4B) and the polishing step (refer to HG 4C) of the substrate 30 in the above step, the cutoff step (refer to FIG. 4D) of the substrate 30 is performed; however, the present invention is not limited to this order. The grinding step and the polishing step of the substrate 30 may be conducted, after cutting off the substrate 30.

The IC chip 39 to be completed through the above step has a feature in its thin thickness and light weight. Further, the IC chip 39 has a feature that the design is not deteriorated due to its thin thickness even if the IC chip is mounted on products.

Embodiment Mode 3

Embodiment Mode 3 of the present invention is described referring to FIGS. 7A to 9. In the present embodiment mode, operation using a frame (carrier jig) in the step of Embodiment Mode 1 is described.

First of all, the insulating film 9 is formed over the substrate 10, and the layer 11 having a plurality of thin film integrated circuits is formed over the insulating film 9 as described above. Subsequently, the first film or the resin layer 12 is pasted so as to cover the layer 11 having a plurality of thin film integrated circuits. Then, the second film 13 is pasted so as to cover the first film or the resin layer 12. This step is conducted by setting a stack 52 of the first film or the resin layer 12, the layer 11 having a plurality of thin film integrated circuits, and the substrate 10 over the second film 13 attached to a frame 51 (refer to a cross-sectional view of FIG. 7A, and a perspective view of FIG. 7B).

A porous chuck 53 is set so as to touch one surface of the second film 13 (refer to 8A). The porous chuck 53 has a structure of a porous vacuum chuck.

Subsequently, the porous chuck 53 is processed so as to make one surface of the substrate 10 higher than that of the frame 51. Then, the substrate 10 is fixed, keeping the state where the porous chuck 53 is processed (refer to FIG. 8B).

Then, the substrate 10 is ground by the grinding means 14. Subsequently, the substrate 10 is polished by the polishing means 16 such as an abrasive cloth. The loose grain 15, or the like may also be used here (refer to FIG. 8C). Note that the size of the loose grain used in the present embodiment mode may be approximately 1 μm.

Here, it is required to transfer the substrate 10 without distortions in moving to the next phase of the process, since the thickness of the substrate 10 has been thinned due to the grinding and polishing steps. Then, an arm 54 is set to overlap with the substrate 10, and the arm 54 and the frame 51 are transferred together (refer to FIG. 9).

The subsequent step may be conducted either after removing the stack 52 from the frame 51, or keeping the state where the stack 52 is set over the frame 51.

Embodiment Mode 4

Embodiment Mode 4 of the present invention is described referring to FIGS. 1A to 2C, 10 to 13, and 19A to 20C. In the present embodiment mode, a structure of the layer 11 having a plurality of thin film integrated circuits formed over one surface of the substrate 10 having an insulating surface (a structure of an IC chip in which an antenna is incorporated) is described with accompanying drawings.

Figure 19A:
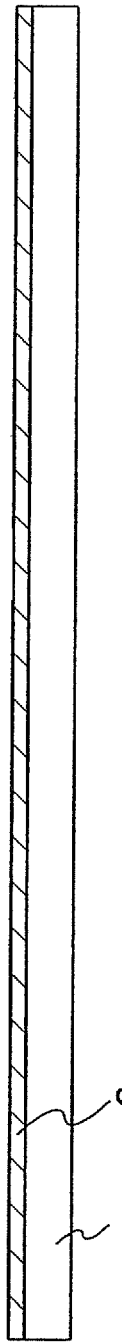
FIGS. 19A to 19C are views illustrating a manufacturing method of an IC chip of the present invention (Embodiment Mode 4)
Figure 19B:
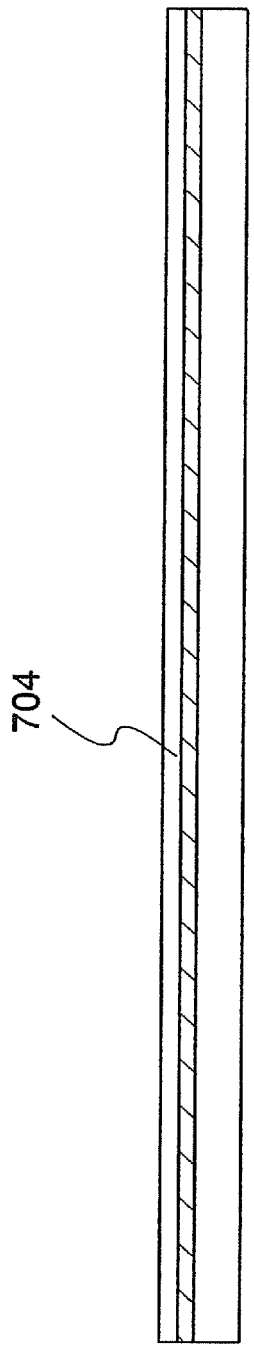
Figure 19C:
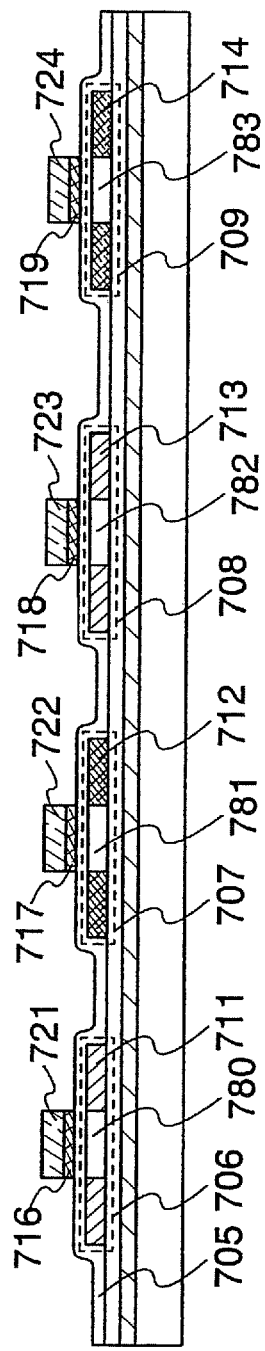

A first insulating film 9 to be a base film is formed over a substrate 10 (refer to FIG. 19A). The first insulating film 9 is formed with a stacked film of silicon nitride oxide and silicon oxynitride, a stacked film of silicon oxynitride, silicon nitride oxide, and silicon oxynitride, or a stacked film of silicon oxide, silicon nitride oxide, and silicon oxynitride.

Subsequently, a plurality of elements is formed over the first insulating film 9. The plurality of elements here correspond to a plurality of elements selected from a thin film transistor, a capacitor, a resistor, a diode, or the like. Here, the manufacturing method of the element is described. First, an amorphous semiconductor film 704 (for example, a film formed with an amorphous silicon as a main component) is formed over the first insulating film 9 (refer to FIG. 19B). The amorphous semiconductor film 704 is formed with a thickness of 25 to 200 nm (preferably 30 to 150 nm) by a sputtering method, an LPCVD method, a plasma CVD method, or the like. Then, a crystalline semiconductor film is formed by crystallizing the amorphous semiconductor film 704 by a laser crystallization method, a thermal crystallization method using RTA or an annealing furnace, a thermal crystallization method using a metal element which promotes crystallization, a method combining a thermal crystallization method using a metal element which promotes crystallization and a laser crystallization method. Subsequently, the crystalline semiconductor film obtained is etched into a desirable shape to form crystalline semiconductor films 706 to 709 (refer to FIG. 19C). Note that the insulating film 9 and the amorphous semiconductor film 704 can be formed in succession without exposing to atmosphere.

An example of the manufacturing step of the crystalline semiconductor films 706 to 709 is briefly described, hereinafter. As a method for crystallizing an amorphous semiconductor film, there is a laser crystallization method, a thermal crystallization method using RTA or an annealing furnace, a thermal crystallization method using a metal element which promotes crystallization, a method combining a thermal crystallization method using a metal element which promotes crystallization and a laser crystallization method, or the like. In addition, as another crystallization method, crystallization may be conducted by generating thermal plasma by applying DC bias and reacting the thermal plasma with a semiconductor film.

In the present embodiment mode, an amorphous semiconductor film with a thickness of 40 to 300 nm is formed by a plasma CVD method, and the crystalline semiconductor films 706 to 709 crystallized by heat treatment are formed. As the heat treatment, a laser heating furnace, laser irradiation, or light irradiation with a lamp instead of laser light (hereinafter, described as a lamp annealing) can be used. Alternatively, those can be combined.

In the case of using laser irradiation, a continuous wave laser beam (CW laser beam) or a pulsed laser beam can be used. As an applicable laser beam, the following can be used: a gas laser such as Ar laser, Kr laser, and excimer laser; a single crystal laser such as YAG, YVO$_4$, forsterite (Mg$_2$Sio$_4$), YAlO$_3$, GdVO$_4$, or a polycrystal (ceramic) laser such as YAG, Y$_2$O$_3$, YVO$_4$, YAlO$_3$, or GdVO$_4$, which is doped with one or more media selected from Nd, Yb, Cr, Ti, Ho, Er, Tm, and Ta; or a glass laser, a ruby laser, an alexandrite laser, a Ti: sapphire laser, a copper vapor laser, a gold vapor laser. By irradiation with a fundamental wave of such laser beams, and laser beams in the range from a second harmonic to a fourth harmonic of the fundamental wave, crystal with a large grain size can be obtained. For example, wavelength of a second harmonic (532 nm) or wavelength of a third harmonic (355 nm) of an Nd:YVO$_4$ laser (fundamental wave: 1064 nm) can be used. The laser energy density at this time is required to be approximately 0.01 to 100 MW/cm$^2$ (preferably, 0.1 to 10 MW/cm$^2$). Then, scanning speed is set approximately 10 to 2000 cm/sec for irradiation.

Note that continuous oscillation is possible with each of the Ar ion laser, Ti: the sapphire laser, and the single crystal laser such as YAG, YVO$_4$, forsterite (Mg$_2$Sio$_4$), YAlO$_3$, GdVO$_4$, or a polycrystal (ceramic) laser such as YAG, Y$_2$O$_3$, YVO$_4$, YAlO$_3$, or GdVO$_4$, which is doped with one or more media selected from Nd, Yb, Cr, Ti, Ho, Er, Tm, or Ta. In addition, pulsed oscillation with an oscillation frequency of 10 MHz or more is possible with such lasers by performing Q switch operation or mode locking. When a laser beam is oscillated with an oscillation frequency of 10 MHz or more, a semiconductor film is irradiated with the subsequent pulse while the semiconductor film is solidified after melting by laser. Therefore, crystal grains grown continuously toward a scanning direction can be obtained since a solid-liquid interface can be moved continuously in the semiconductor film, which is different from the case of using a pulsed laser with a low oscillation frequency.

It is possible to form a medium in a free shape in short time and at low cost, when ceramic (polycrystals) is used as a medium. In the case of using single crystals, a columned medium with several mm in diameter and several ten mm in length is usually used; however, it is possible to make a larger medium when ceramic is used.

Dopant concentration such as Nd and Yb in a medium which contributes directly to light emission is difficult to change drastically in neither single crystals nor polycrystals. Thus, there is an approximate limit in the improvement of laser output due to the increase of dopant concentration. However, a drastic improvement of the output can be expected in the case of ceramic since the size of a medium can be enlarged markedly, compared with single crystals.

Further, a medium with a parallelepiped or cuboid shape can be easily formed in the case of ceramic. When oscillated light is moved in a zigzag manner in the medium using the medium having such a shape, long oscillation light path can be obtained. Therefore, amplification is enlarged, and it is possible to oscillate with large output. Moreover, the laser beam emitted from the medium having such a shape has a square cross sectional shape in irradiation. Thus, it is advantageous for being adjusted into a linear beam, compared with circular beam. By adjusting the laser beam emitted in this manner with an optical system, it is possible to obtain a linear beam having a short side of 1 mm or less and a long side of several mm to several m. Further, by irradiation with a medium with excited light uniformly, a linear beam has uniform energy distribution in a long side direction.

By irradiating the semiconductor film with this linear beam, it is possible to anneal the whole surface of the semiconductor film uniformly. In the case where it is required to anneal with until both ends of the linear beam uniformly, slits are disposed in both ends and light is prevented from being irradiated to an energy attenuation portion.

The semiconductor film obtained in this manner is annealed with the linear beam having uniform intensity, and a semiconductor device is manufactured with the semiconductor film. Then, the characteristic of the semiconductor device can be made excellent and uniform.

One example of a specific method is given as a thermal crystallization method using a metal element which promotes crystallization. After keeping a solution containing nickel serving as a metal element which promotes crystallization over an amorphous semiconductor film, a crystalline semiconductor film is formed by conducting dehydrogenation treatment (500° C., 1 hour) and thermal crystallization treatment (550° C., 4 hours) over an amorphous semiconductor film. Then, laser light is emitted as required to form crystalline semiconductor films 706 to 709.

With the thermal crystallization method using a metal element which promotes crystallization, crystallization of an amorphous semiconductor film becomes possible at low temperature and in short time. Further, the crystallization method has an advantage that the direction of crystallization can be uniformed. On the other hand, since the metal element remains in a crystalline semiconductor film, off-current increases and there arises a disadvantage that characteristics are not stable. Here, an amorphous semiconductor film functioning as a gettering site is preferably formed over a crystalline semiconductor film. Since an impurity element such as phosphorus or argon is required to be contained in the amorphous semiconductor film functioning as a gettering site, a sputtering method which can include argon in high concentration is preferably used for forming the amorphous semiconductor film. After that, heat treatment (RTA method, thermal anneal using an annealing furnace, or the like) is conducted, so that the metal element is diffused in the amorphous semiconductor film. Subsequently, the amorphous semiconductor film containing the metal element is removed. By conducting such a gettering process, the metal element in a crystalline semiconductor film can be reduced in concentration or removed.

Subsequently, a gate insulating film 705 is formed covering the crystalline semiconductor films 706 to 709. The gate insulating film 705 is formed with a single layer or stacked layers of a film containing oxide of silicon or nitride of silicon by a plasma CVD method or a sputtering method. Specifically, a film containing silicon oxide, a film containing silicon oxynitride, or a film containing silicon nitride oxide is formed as a single layer. Alternatively, these layers are stacked properly. Moreover, the surfaces of the crystalline semiconductor films 706 to 709 may be oxidized or nitrided to form a gate insulating film by conducting the high-density plasma treatment in the atmosphere containing oxygen, nitrogen or both of oxygen and nitrogen to the crystalline semiconductor films 706 to 709. The gate insulating film formed by the high-density plasma treatment is superior to a film formed by a CVD method or a sputtering method in uniformity of thickness and quality. Moreover, a dense film can be formed with the gate insulating film. As atmosphere containing oxygen, a mixed gas of rare gas and oxygen ($O_2$) or dinitrogen monoxide ($N_2O$), or a mixed gas of rare gas, hydrogen ($H_2$), and oxygen ($O_2$) or dinitrogen monoxide ($N_2O$) can be used. As atmosphere containing nitrogen, a mixed gas of rare gas and nitrogen ($N_2$) or ammonia ($NH_3$), or a mixed gas of rare gas, hydrogen ($H_2$), and nitrogen ($N_2$) or ammonia ($NH_3$) can be used.

Next, a first conductive layer and a second conductive layer are stacked over the gate insulating film 705. The first conductive layer is formed with a thickness of 20 to 100 nm by a plasma CVD method or a sputtering method. The second conductive layer is formed with a thickness of 100 to 400 nm. The first conductive layer and the second conductive layer are formed with an element selected from tantalum (Ta), tungsten (W), titanium (Ti), molybdenum (Mo), aluminum (Al), copper (Cu), chromium (Cr), niobium (Nb), or the like, or alloy or chemical material containing those elements as a main component. In addition, these layers can be formed with a semiconductor material represented by polycrystalline silicon doped with an impurity element such as phosphorus. As an example of combination of the first conductive layer and the second conductive layer, a tantalum nitride (TaN) film and a tungsten (W) film, a tungsten nitride (WN) film and a tungsten film, a molybdenum nitride (MoN) film and a molybdenum (Mo) film, or the like can be given. Since tungsten or tantalum nitride has a high heat durability, heat treatment for thermal activation can be conducted after forming the first conductive layer and the second conductive layer. In addition to a two-layer structure of the first conductive layer and the second conductive layer, a single-layer structure or a three-layer structure may be employed. In the case of the three-layer structure, a structure obtained by stacking a molybdenum film, an aluminum film, a molybdenum film in order over the substrate or a structure obtained by stacking a titanium film, an aluminum film, or a titanium film in order is preferably employed.

Subsequently, a mask formed with a resist is formed by photolithography, and etching treatment is conducted for forming a gate electrode and a gate line to form conductive layers 716 to 719, and 721 to 724 (hereinafter, called as a gate electrode in some cases) serving as a gate electrode.

An impurity element imparting n-type conductivity is added in low concentration to the crystalline semiconductor films 706 and 708 by an ion doping method or an ion injection method after forming a mask formed with a resist by photolithography. In this manner, n-type impurity regions 711 and 713 and channel formation regions 780 and 782 are formed. For the impurity element imparting n-type conductivity, the element belonging to group 15 may be employed, such as phosphorus (P) and arsenic (As).

Subsequently, a mask formed with a resist is formed by photolithography, and an impurity element imparting p-type conductivity is added to the crystalline semiconductor films 707 and 709 to form p-type impurity regions 712 and 714 and channel formation regions 781 and 783. As the impurity element imparting p-type conductivity, boron (B) is employed, for example. As for the order of forming the n-type impurity regions 711 and 713 and the p-type impurity regions 712 and 714, the p-type impurity regions 712 and 714 may be formed after forming the n-type impurity regions 711 and 713, as in the present embodiment mode. Alternatively, the n-type impurity regions 711 and 713 may be formed after forming the p-type impurity regions 712 and 714.

Subsequently, an insulating film is formed so as to cover the gate insulating film 705 and the conductive layers 716 to 719, and 721 to 724. The insulating film is formed with a single layer or stacked layers of a film formed with an inorganic material such as silicon, oxide of silicon, or nitride of silicon, and a film formed with an organic material such as organic resin by a plasma CVD method or a sputtering method. Subsequently, the insulating film is selectively etched by an anisotropic etching mainly in the perpendicular direction to form insulating films (called as sidewalls in some cases) 739 to 742 touched with side faces of the conductive layers 716 to 719 and 721 to 724 (refer to FIG. 20A). Further, insulating films 734 to 737 formed by etching the gate insulating film 705 are formed at the same time as the insulating films 739 to 742. The insulating films 739 to 742 are used as doping masks for doping in forming LDD (Lightly Doped drain) regions later.

Subsequently, by using a mask formed with a resist by photolithography and the insulating films 739 to 742 as masks, an impurity element imparting n-type conductivity is added into the crystalline semiconductor films 706 and 708 to form first n-type impurity regions (called as LDD regions in some cases) 727 and 729, and second n-type impurity regions 726 and 728. The concentration of the impurity element contained in the first n-type impurity regions 727 and 729 is lower than that of the second n-type impurity regions 726 and 728. Through the above step, n-type thin film transistors 62 and 64, and p-type thin film transistors 63 and 65 are completed.

Note that in order to form an LDD region, there is a method where a gate electrode is formed to have a stacked structure of two or more layers, so that etching such as anisotropic is performed to the gate electrode with the use of a conductive layer which makes up a lower layer of the gate electrode as a mask, or a method where insulating films as the sidewalls of the gate electrode are used as masks. The thin film transistor formed by the former method has a structure where the LDD region is disposed by overlapping with the gate electrode with the gate insulating film interposed therebetween. The structure has a difficulty in controlling the width of the LDD region for utilizing etching like anisotropic etching of the gate electrode, and the LDD region cannot be formed in some cases if etching is not conducted preferably. On the other hand, the latter method that insulating films as the sidewalls are used as masks can make it easy to control the width of the LDD region, compared with the former method, and the LDD region can be formed assuredly.

Note that after removing the exposed n-type impurity regions 726 and 728 and natural oxide films formed over the surface of p-type impurity regions 785 and 730, a silicide region may be formed appropriately using a metal film. As the metal film, a nickel film, a titanium film, a cobalt film, a platinum film, or a film formed with alloy containing at least two elements selected from these can be used. More specifically, when a nickel film is used as the metal film, for example, a silicide region is formed by heat treatment after forming the nickel film by a sputtering method at the a room temperature, at film formation power of 500 W to 1 kW. As the heat treatment, RTA, furnace annealing, or the like can be used. At this time, by controlling thickness, heating temperature, and heating time of the metal film, only the surface or whole of the n-type impurity regions 726 and 728 and the p-type impurity regions 785 and 730 can be made a silicide region. Lastly, unreacted nickel is removed. For example, the unreacted nickel is removed with an etching solution containing $HCl:HNO_3:H_2O=3:2:1$.

Note that although description is made of the example where the thin film transistors 62 to 65 are the top-gate type transistors in this embodiment mode, each of them may be a bottom-gate type thin film transistor. In addition, although description is made of the single-gate structure where each of the thin film transistors 62 to 65 has one channel formation region, a double-gate structure where two channel formation regions are formed or a triple-gate structure where three channel formation regions are formed may be employed. Moreover, a dual-gate structure where two gate electrodes are disposed above and below a channel formation region with the gate insulating films interposed therebetween or other structures may be employed.

As for the structure of the semiconductor film making up the thin film transistors 62 to 65, structures besides the one described in the present embodiment modes may be employed. For example, an impurity region (which includes a source region, a drain region, and an LDD region) may each be formed, and any of a p-channel transistor, an n-channel transistor or a CMOS circuit may be formed. Moreover, insulating films (sidewalls) may be formed so as to touch with the side faces of a gate electrode provided above or below the semiconductor film.

Through the above step, heat treatment for recovering the crystalline property of a semiconductor film or activating an impurity element added into a semiconductor film may be conducted after completing the n-type thin film transistors 62 and 64, and the p-type thin film transistors 63 and 65. Hydrogen may be contained in the surface of the gate insulating film 705 by conducting high-density plasma treatment to the exposed gate insulating film 705 in the atmosphere containing hydrogen, preferably after conducting heat treatment. This is because the hydrogen can be utilized in the subsequent process of hydrogenating the semiconductor film. Moreover, the semiconductor film can be hydrogenated by conducting high-density plasma treatment by heating the substrate at a temperature of 350 to 450° C. in the atmosphere containing hydrogen. Note that a mixed gas of hydrogen ($H_2$) or ammonia ($NH_3$), and rare gas (for example, argon (Ar)) can be used as the atmosphere containing hydrogen. In the case of using a mixed gas of ammonia ($NH_3$) and rare gas (for example, argon (Ar)) as the atmosphere containing hydrogen, the surface of the gate insulating film 705 can be hydrogenated and nitrided at the same time.

Subsequently, an insulating film is formed with a single layer or stacked layers so as to cover the thin film transistors 62 to 65. The insulating film covering the thin film transistors 62 to 65 is formed with a single layer or stacked layers of an inorganic material such as oxide of silicon or nitride of silicon, and an organic material such as polyimide, polyamide, benzocyclobutene, acrylic, epoxy, or siloxane, by an SOG method and a drop discharge method. In the present specification, siloxane means a compound having a skeleton structure of silicon (Si) and oxygen (O) bond, and an organic group (for example, alkyl group, and aromatic hydrocarbon) containing at least hydrogen as a substituent. Further, a fluoro group may be used as a substituent, or both an organic group containing at least hydrogen and a fluoro group may be used as a substituent as well. Note that in the present specification, as the insulating film covering the thin film transistors 62 to 65, a second insulating film 66 is formed using a single-layer structure of a silicon nitride film or a silicon nitride film containing oxygen (refer to FIG. 20B). At this time, by conducting high-density plasma treatment preferably on a silicon nitride film or a silicon nitride film containing oxygen in the atmosphere containing hydrogen, hydrogen is made contained in the surface of the silicon nitride film or the silicon nitride film containing the oxygen. This is because the hydrogen can be utilized in the subsequent process of hydrogenating the semiconductor film. Moreover, the semiconductor film can be hydrogenated by conducting high-density plasma treatment by heating the substrate at a temperature of 350 to 450° C. in the atmosphere containing hydrogen. Note that a mixed gas of hydrogen ($H_2$) or ammonia ($NH_3$), and rare gas (for example, argon (Ar)) can be used as the atmosphere containing hydrogen. In the case of using a mixed gas of ammonia ($NH_3$) and rare gas (for example, argon (Ar)) as the atmosphere containing hydrogen, the surface of the gate insulating film 705 can be hydrogenated and nitrided at the same time.

Note that heat treatment may be conducted for recovering the crystalline property of a semiconductor film or activating an impurity element added into a semiconductor film, before forming the second insulating film 66. For heat treatment, thermal annealing, a laser annealing method, an RTA method, or the like may be employed. For example, thermal annealing at 500° C. or more may be conducted for the purpose of activation of an impurity element. Thermal annealing at 350 to 450° C. may be conducted for the purpose of hydrogenation of the semiconductor film.

Subsequently, the second insulating film 66 is etched by photolithography to form contact holes exposing the n-type impurity regions 726 and 728, and the p-type impurity regions 785 and 730. Then, conductive layers are formed to fill the contact holes, and the conductive layers are patterned to form conductive layers 71 to 76 functioning as source or drain wires.

The conductive layers 71 to 76 are formed with a conductive layer containing aluminum (Al) as a main component by a plasma CVD method or a sputtering method. The conductive layer containing aluminum as a main component corresponds to a material containing nickel and also containing aluminum as a main component, or an alloy material which contains aluminum as a main component, also containing nickel, and one or both of carbon and silicon. Since the conductive layer containing aluminum as a main component generally has a disadvantage in heat durability, a structure where top and bottom sides of the conductive layer containing aluminum as a main component are interposed with barrier films is preferable. The barrier film indicates the one having a function of controlling hillocks of the conductive layer containing aluminum as a main component or a function of increasing durability. As the material having such a function, chrome, tantalum, tungsten, molybdenum, titanium, silicon, nickel, or nitride of such materials can be given. As one example of a structure of the conductive layers 71 to 76, a structure obtained by stacking a titanium film, an aluminum film, a titanium film in order over the substrate can be given. Since the titanium film has an element having a high reducing property, even if a thin natural oxide film is produced over the crystalline semiconductor film, the natural oxide film can be reduced to form a preferable contact between the titanium film and the crystalline semiconductor film. Moreover, the surface is preferably nitrided by conducting high-density plasma treatment to the titanium film formed between the crystalline semiconductor film and the aluminum film in the atmosphere containing nitrogen. As the conditions of high-density plasma treatment, electron density of plasma is set to $10 \times 10^{11}$ cm$^{-3}$ or more to $1 \times 10^{13}$ cm$^{-3}$ or less, and electron temperature of plasma is set to 0.5 eV or more to 1.5 eV or less. As the atmosphere containing nitrogen, a mixed gas of $N_2$ or $NH_3$ and rare gas, or a mixed gas of $N_2$ or $NH_3$, rare gas, and $H_2$ may be employed. Nitriding the surface of the titanium film can prevent titanium and aluminum from alloying in heat treatment in a latter step, and diffusion of aluminum into the crystalline semiconductor film through the titanium film can be prevented. Note that although a description is made of the example where the aluminum film is interposed with the titanium films here, in the case of using a chrome film, a tungsten film, or the like, instead of the titanium film, the same process can be carried out. More preferably, formation of the titanium film, nitriding treatment of the titanium film surface, formation of the aluminum film, and formation of the titanium film are conducted in succession without exposing to the atmosphere by using a multi-chamber device.

Figure 20A:
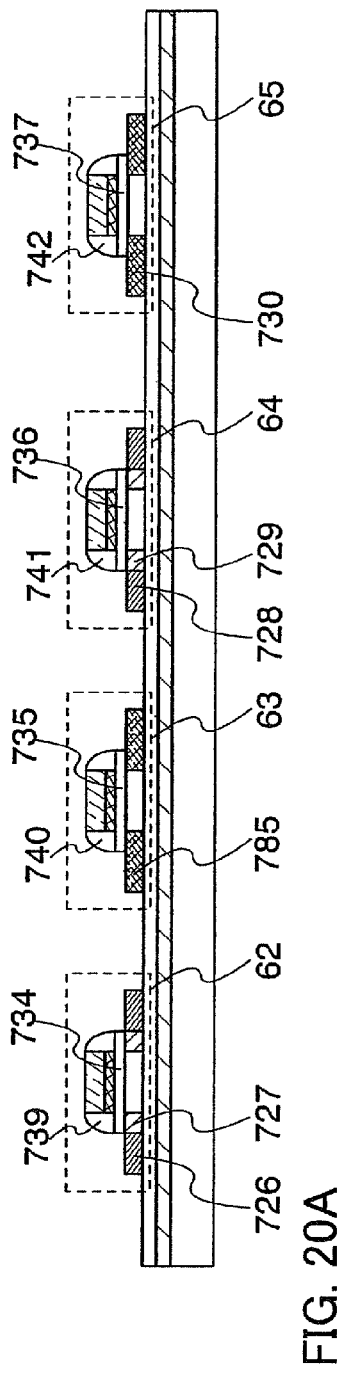
FIGS. 20A to 20C are views illustrating a manufacturing method of an IC chip of the present invention (Embodiment Mode 4).
Figure 20B:
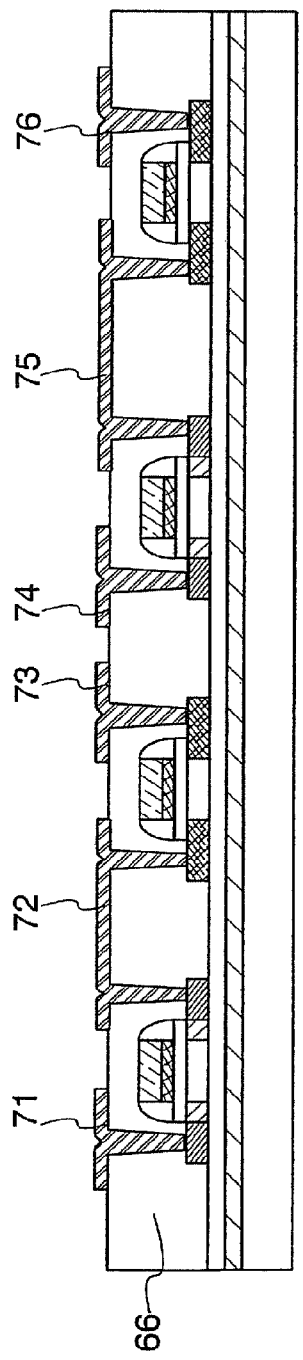
Figure 20C:
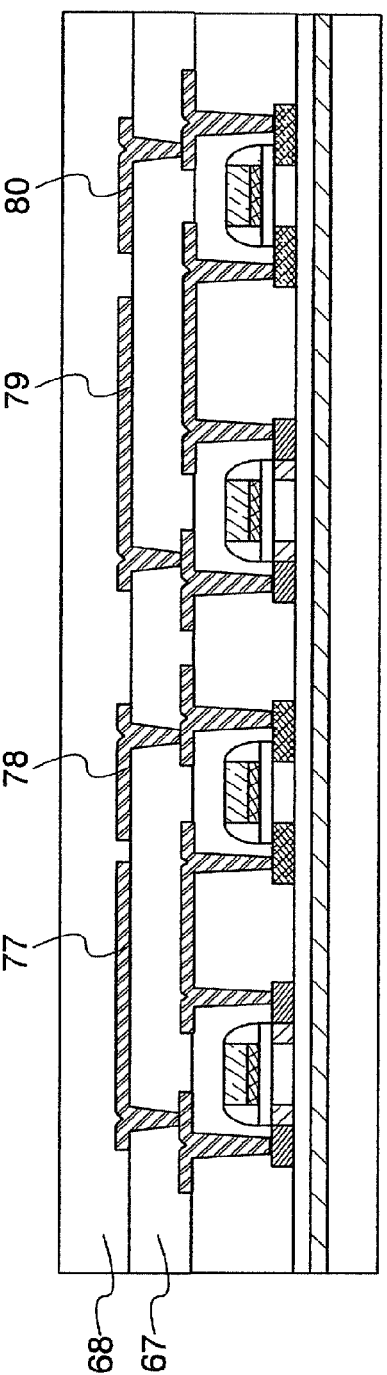

Subsequently, a third insulating film 67 is formed so as to cover the conductive layers 71 to 76 (refer to FIG. 20C). The third insulating film 67 is formed with a single layer or stacked layers of an inorganic material, or an organic material by a SOG method, a drop discharge method, or the like. In the present embodiment mode, the third insulating film 67 is formed with a thickness of 0.75 to 3 μm.

Subsequently, the third insulating film 67 is etched by photolithography to form contact holes exposing the conductive layers 71 to 76. Then, conductive layers 77 to 80 are formed so as to fill the contact holes over the third insulating film 67. As a method of forming the conductive layers, a CVD method, a sputtering method, a plating method, or evaporation method may be employed, and one of elements selected from Au, Ag, Cu, Ni, Pt, Pd, Ir, Rh, W, Al, Ta, Mo, Cd, Zn, Fe, Ti, Zr, or Ba, alloy or a compound containing such elements can be used as the conductive layers. Moreover, a compound of Si or Ge having conductivity can be used. The conductive layers 77 to 80 function as an antenna.

Through the above step, an element can be completed.

Figure 10:
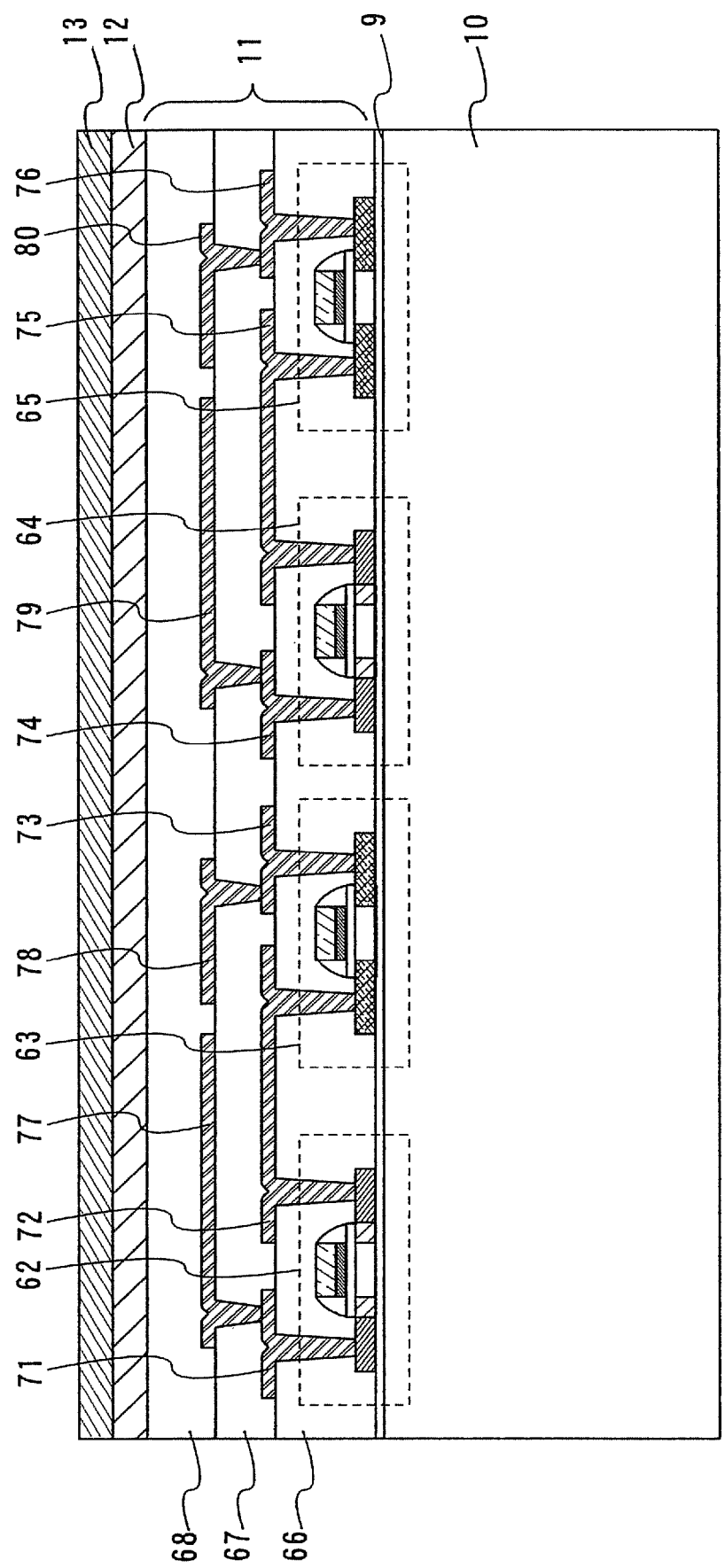
FIG. 10 is a view illustrating a manufacturing method of an IC chip of the present invention (Embodiment Mode 4)

Subsequently, a fourth insulating film 68 is formed so as to cover the conductive layers 77 to 80 functioning as an antenna by a SOG method, a drop discharge method, or the like (refer to FIG. 10). Through the step, the layer 11 having a thin film integrated circuit is formed.

Subsequently, the first film or the resin layer 12 is adhered so as to cover the layer 11 having a plurality of thin film integrated circuits. Then, the second film 13 is adhered onto the first film or the resin layer 12 (refer to FIG. 10 and FIG. 1A). Next, the substrate 10 is ground and polished (refer to FIG. 11 and FIGS. 1B and 1C).

Figure 11:
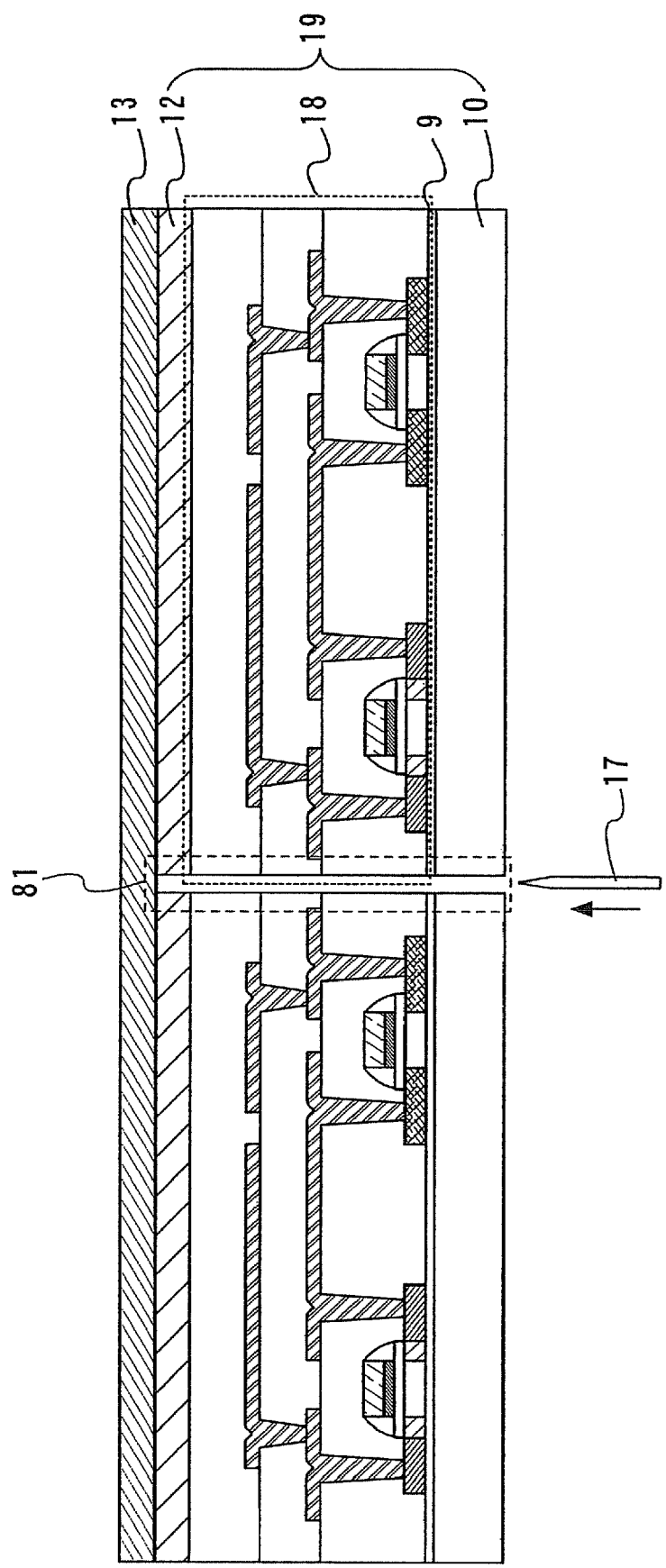
FIG. 11 is a view illustrating a manufacturing method of an IC chip of the present invention (Embodiment Mode 4)

Subsequently, the substrate 10 formed with the first insulating film 9 over one surface, the layer 11 having a plurality of thin film integrated circuits, and the first film or the resin layer 12 are cut off by the cutoff means 17 to form an open portion 81 (refer to FIG. 11, and FIG. 1D). More specifically, the open portion 81 is formed by cutting the substrate 10, the first insulating film 9, the insulating films 66 to 68 included in the layer 11 having a plurality of thin film integrated circuits, and the first film or the resin layer 12. At this time, the elements included in the layer 11 having a plurality of thin film integrated circuits are not cut off.

The plurality of thin film integrated circuits 18 is formed through the above step. Moreover, the plurality of IC chips 19 are formed as a stack of the substrate 10 formed with the first insulating film 9 over one surface, the thin film integrated circuits 18, and the first film or the resin layer 12.

The subsequent step is performed in the way as shown in the Embodiment Mode 1, and the detail thereof is described hereinafter.

Figure 12A:
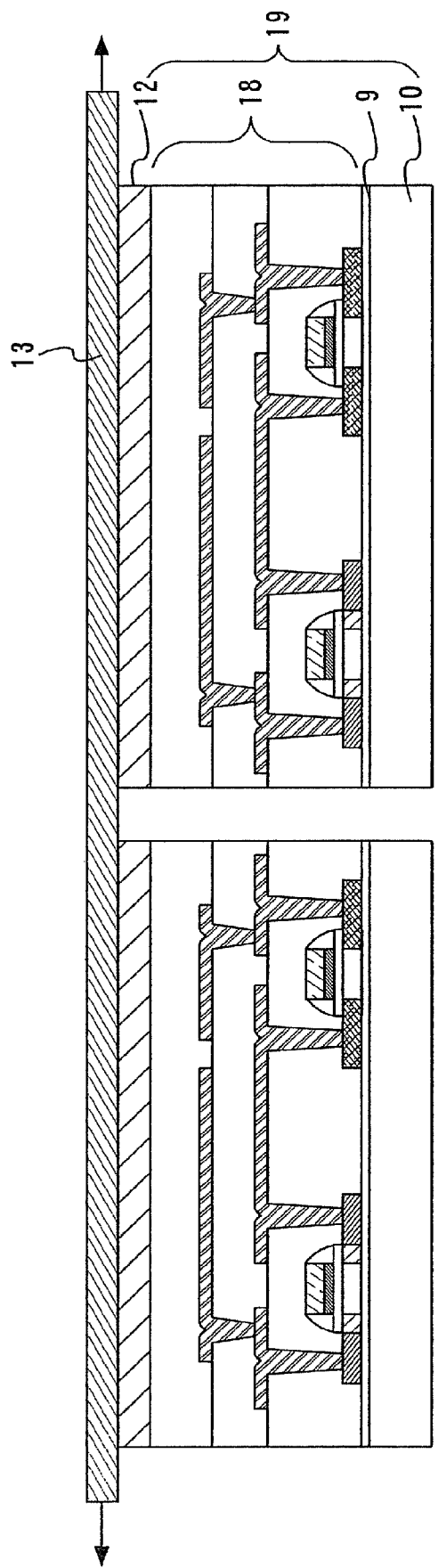
FIGS. 12A and 12B are views illustrating a manufacturing method of an IC chip of the present invention (Embodiment Mode 4)
Figure 12B:
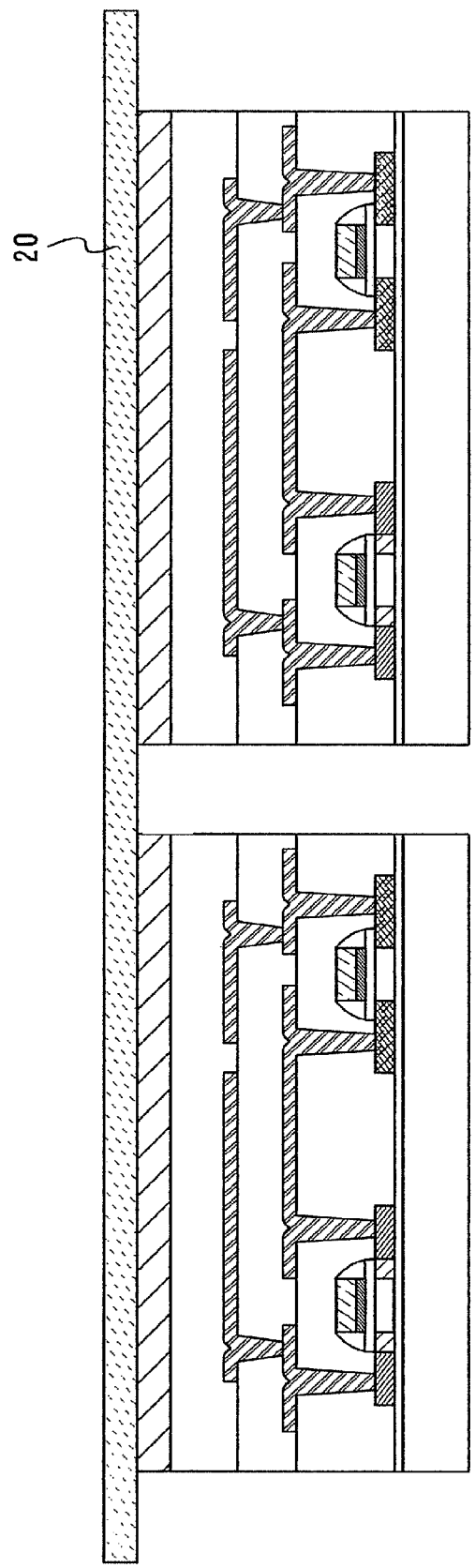
Figure 13:
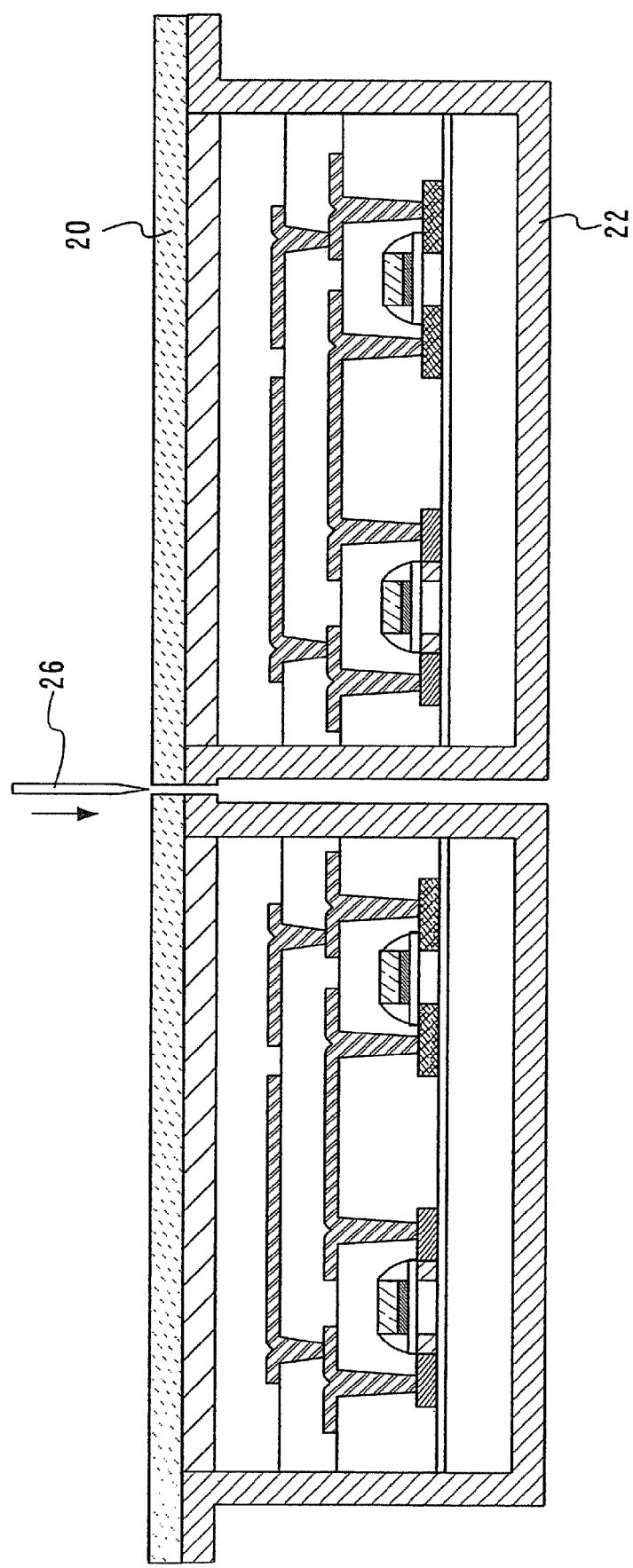
FIG. 13 is a view illustrating a manufacturing method of an IC chip of the present invention (Embodiment Mode 4)

After forming the plurality of IC chips 19, the second film 13 is stretched so as to form the gaps between the IC chips 19 (refer to FIGS. 12A and 2A). Subsequently, the second film 13 is irradiated with light, for reducing adhesiveness between one surface of the IC chip 19 and the second film 13. Then, the IC chip 19 is separated from the second film 13, and one surface of the IC chip 19 is adhered to the first base 20 (refer to FIG. 12B, FIGS. 2A and 2B). Subsequently, the other surface of the IC chip 19 is adhered to the second base 22 (refer to FIG. 13, FIGS. 2B and 2C). Then, the portion where the first base 20 is adhered to the second base 22 is cut off by the cutoff means 26. As a result, the IC chip 19 sealed with the first base 20 and the second base 22 is completed.

Embodiment Mode 5

In the present embodiment mode, description is made of a structure of a semiconductor device in which an antenna formed over another substrate after completing an IC chip is electrically connected to an IC chip.

Figure 14A:
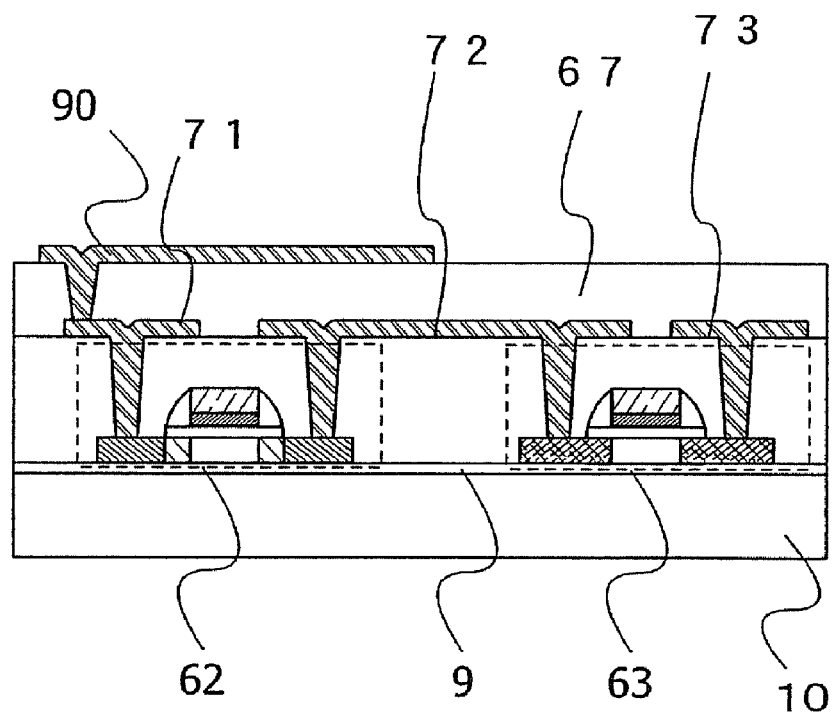
FIGS. 14A and 14B are views illustrating a manufacturing method of an IC chip of the present invention (Embodiment Mode 5)

FIG. 14A shows a cross-sectional view of a semiconductor device in a manufacturing step in the present embodiment mode. In FIG. 14A, an n-channel type thin film transistor 62, a p-channel type thin film transistor 63, and conductive layers 71 to 73 are provided, a third insulating film 67 is formed so as to cover a wire over the substrate 10 formed with a first insulating film 9 over one surface, and a wire 90 electrically connected to the n-channel type thin film transistor 62 through a contact hole formed in the insulating film 67 is provided. The step until here is the same as the step up to the point of forming the contact hole in the insulating film 67 in FIG. 10 except that the wire 90 is formed. Thus, the description is omitted.

Figure 14B:
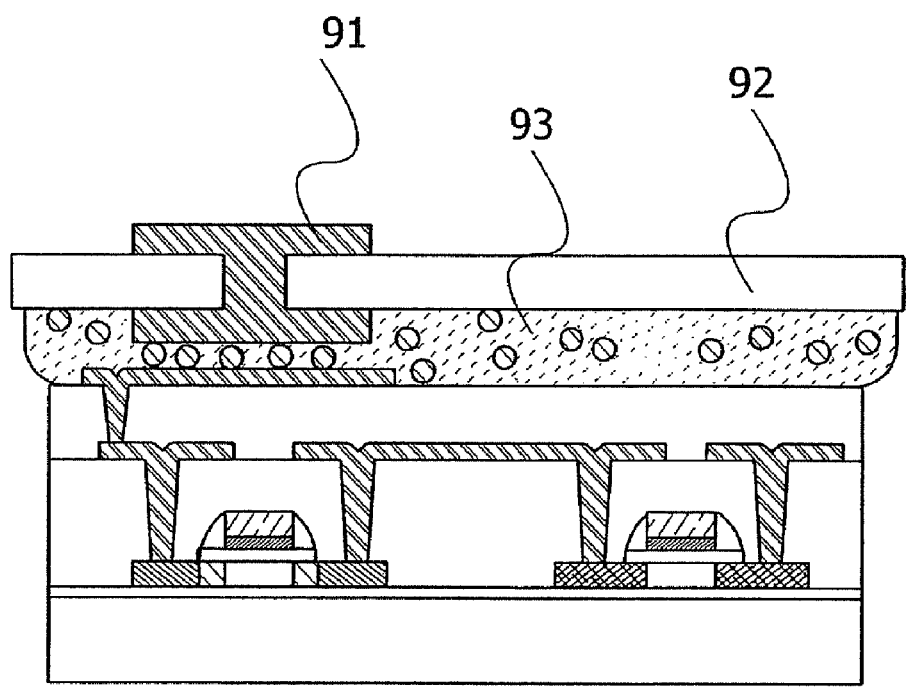

Subsequently, an adhesive agent 93 is applied onto the insulating film 67 so as to cover the wire 90 electrically connected to the n-channel type thin film transistor 62, and a covering material 92 is adhered to the insulating film 67 by the adhesive agent 93 (refer to FIG. 14B).

An antenna 91 is formed in the covering material 92 in advance. In the present embodiment mode, the antenna 91 is electrically connected to the wire 90 using an anisotropic conductive resin for the adhesive agent 93.

The anisotropic conductive resin is a material in which a conductive material is diffused in a resin. As the resin, there are an epoxy resin, an urethane resin, and an acrylic resin which has a thermosetting property, a polyethylene resin, and a polypropylene resin which has a thermoplastic property, and a siloxane resin. As a conductive material, there is a plastic particle such as polystyrene, and epoxy which is coated with Ni or Au, a metal particle such as Ni, Au, Ag, and solder, particulate or fibrous carbon, or fibrous Ni coated with Au. The size of the conductive material is preferably determined in accordance with a pitch of the antenna 91 and the wire 90.

The antenna 91 and the wire 90 may be electrically connected by pressure bonding with the use of an anisotropic conductive resin while applying ultrasonic waves or hardening with ultraviolet irradiation.

Note that in the present embodiment mode, an example that the antenna 91 is electrically connected to the wire 90 with the adhesive agent 93 using an anisotropic conductive resin is described; however, the present invention is not limited to this structure. Instead of the adhesive agent 93, an anisotropic conductive film may be used, so that the antenna 91 is electrically connected to the wire 90 by conducting pressure bonding to the anisotropic conductive film.

Embodiment 1

A thin film integrated circuit manufactured by the present invention corresponds to the one having a plurality of elements and a conductive layer functioning as an antenna, or the one which is formed with a plurality of elements and has an electrode having a connection with a medium serving as an antenna. The plurality of elements here corresponds to a thin film transistor, a capacitor, a resistor, a diode, or the like.

Figure 15:
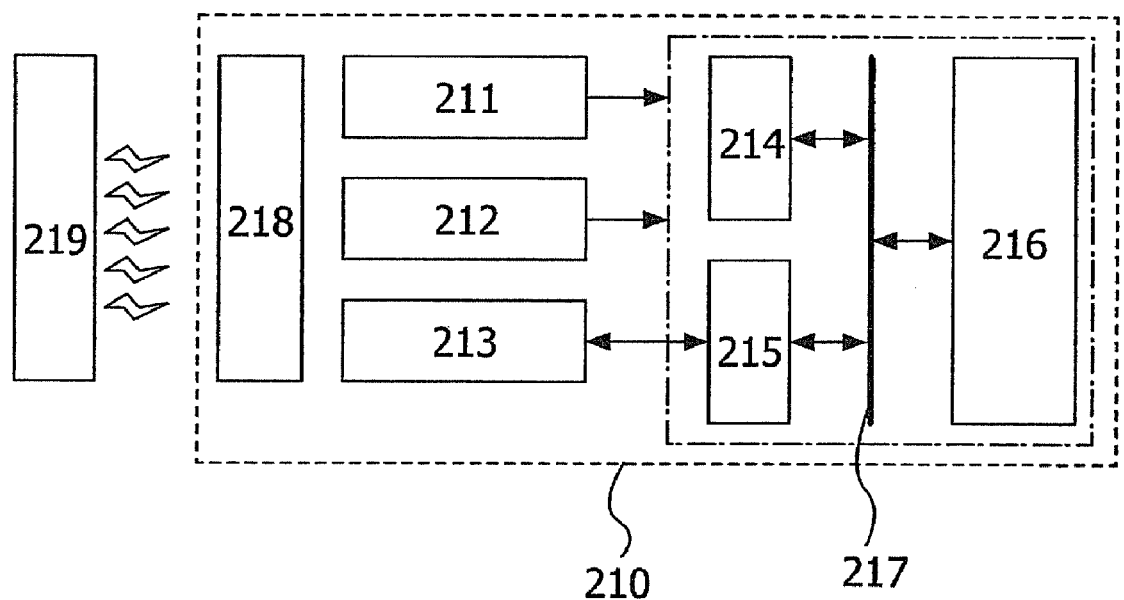
FIG. 15 is a view illustrating a structure of an IC chip (Embodiment 1)

A thin film integrated circuit 210 included in an IC chip (a semiconductor device, an RF tag, a wireless tag, an electronic tag, a wireless processor, a wireless memory, or the like) has a function of communicating data without contact, and the thin film integrated circuit 210 includes a plurality of elements making up various circuits. For example, the thin film integrated circuit 210 has a power supply circuit 211, a clock generator circuit 212, data demodulation/modulation circuit 213, a control circuit 214, an interface circuit 215, a memory 216, and a data bus 217. In the case of making up an antenna-interoperated IC chip (an RF tag, a wireless tag, an electronic tag, a wireless processor, a wireless memory, or the like), an antenna 218 (called as an antenna coil in some cases), or the like is also incorporated (refer to FIG. 15).

The power supply circuit 211 generates each power to be supplied to each circuit, based on the alternate current signal inputted from an antenna 218 or an external antenna 91. The clock generator circuit 212 generates each clock to be supplied to each circuit, based on the alternate-current signal inputted from the antenna 218 and the antenna 91. The data demodulation/modulation circuit 213 (a circuit including a demodulation circuit and a modulation circuit) has a function of demodulating/modulating data communicated with a reader/writer 219. The control circuit 214 corresponds to a CPC (Central Processing Unit), a MPU (Micro Processor Unit), or the like, for example, and has a function of controlling other circuit. The antenna 218 has a function of receiving/sending electromagnetic waves. The reader/writer 219 controls communication with a thin film integrated circuit, control thereof, and data processing related to the control.

The antenna 218 or the external antenna 91 has a function of converting an electromagnetic wave into an alternate-current signal. Load modulation is applied to the antenna 218 and the antenna 91 by the data demodulation/modulation circuit 213. The alternate-current signal changed by the antenna 218 and the antenna 91 is supplied to the power supply circuit 211, the clock generator circuit 212, the data demodulation/modulation circuit 213, and the like.

Note that the circuit made up with the thin film integrated circuit is not limited to the above structure, and a structure to which other components such as a limiter circuit of power supply voltage, or hardware dedicated to encryption/decryption functions may be employed.

Note that the present embodiment can be freely combined with the Embodiment Modes 1 to 5.

Embodiment 2

Figure 16A:
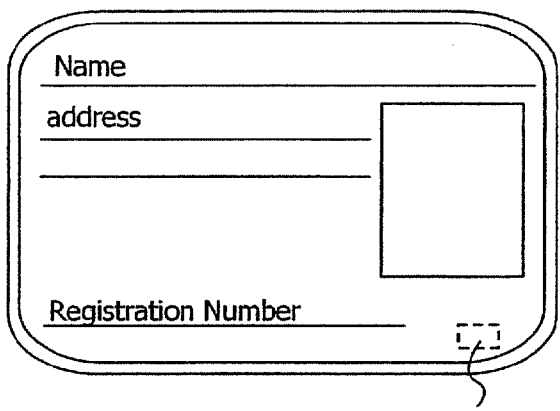
FIGS. 16A to 16E are view illustrating a usage of an IC chip (Embodiment 2)
Figure 16B:
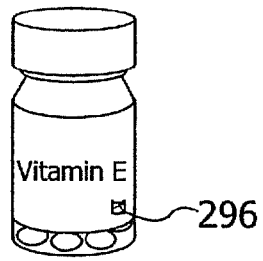
Figure 16C:
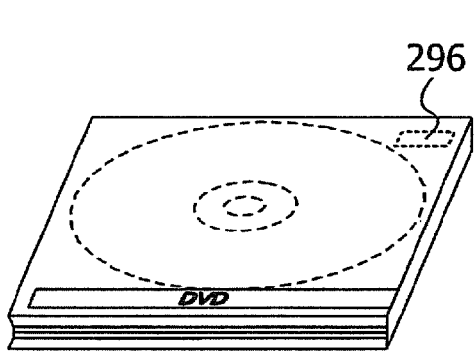
Figure 16D:
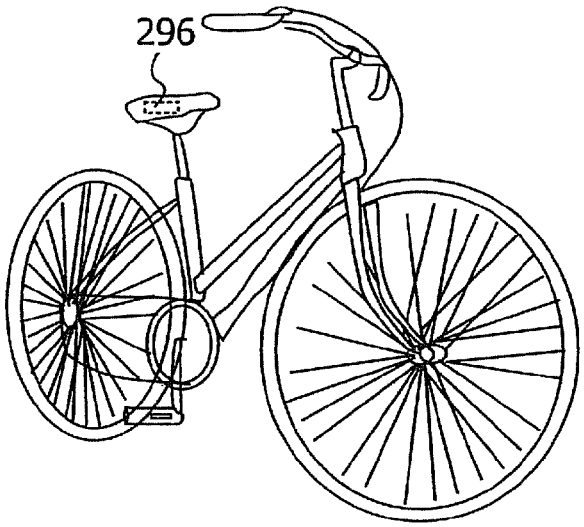
Figure 16E:
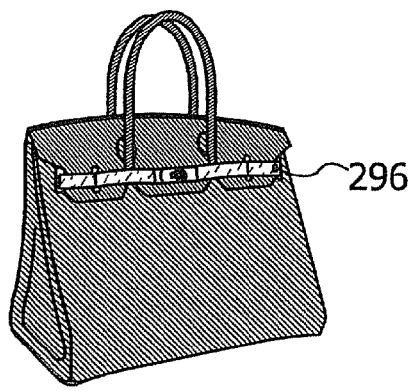

An IC chip (an RF tag, a wireless tag, an electronic tag, a wireless processor, a wireless memory, or the like) 296 including a thin film integrated circuit manufactured according to the present invention is applicable in a wide range. For example, the IC chip 296 can be applied to a paper money, a coin, documents of value, unregistered bonds, identification certificates (driver's license, certificate of residence, and the like, refer to FIG. 16A), packaging containers (package paper, a bottle, and the like, refer to FIG. 16B), a recording medium (DVD software, a video tape, and the like, refer to FIG. 16C), means of transportation (a bicycle and the like, refer to FIG. 16D), personal belongings (a bag, glasses, and the like, refer to FIG. 16E), foods, clothes, general merchandise, electronic appliances, and the like. The electronic appliances are a liquid crystal display device, an EL display device, a television device (also referred to as simply a TV, a TV receiver, or a television receiver), a mobile phone, and the like.

The thin film integrated circuit and the IC chip (an RF tag, a wireless tag, an electronic tag, a wireless processor, a wireless memory, or the like) including the thin film integrated circuit are fixed to the object by pasting them to the surface of the object or embedding them in the object. For example, if the object is a book, they are fixed to the book by embedding them in the paper, and if the object is a package made of an organic resin, they are fixed to the package by embedding them in the organic resin. By providing the thin film integrated circuit and the IC chip (an RF tag, a wireless tag, an electronic tag, a wireless processor, a wireless memory, or the like) including the thin film integrated circuit in a paper money, a coin, documents of value, unregistered bonds, identification certificates, and the like, the forgery can be prevented. Moreover, when the thin film integrated circuit and the IC chip (an RF tag, a wireless tag, an electronic tag, a wireless processor, a wireless memory, or the like) including the thin film integrated circuit are provided in packaging containers, a recording medium, personal belongings, foods, clothes, general merchandise, electronic appliances, and the like, an inspection system, a system at the rental shop, and the like become more efficient. When the thin film integrated circuit and the IC chip (an RF tag, a wireless tag, an electronic tag, a wireless processor, a wireless memory, or the like) including the thin film integrated circuit are provided in vehicles, the forgery and stealing can be prevented.

Figure 17A:
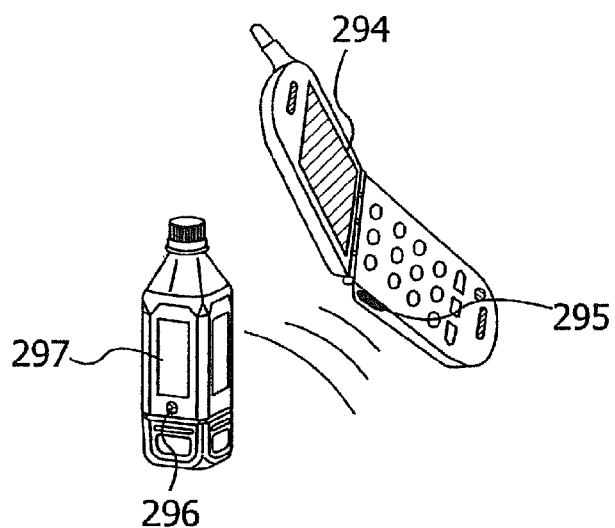
FIGS. 17A and 17B are views illustrating a usage of an IC chip (Embodiment 4)
Figure 17B:
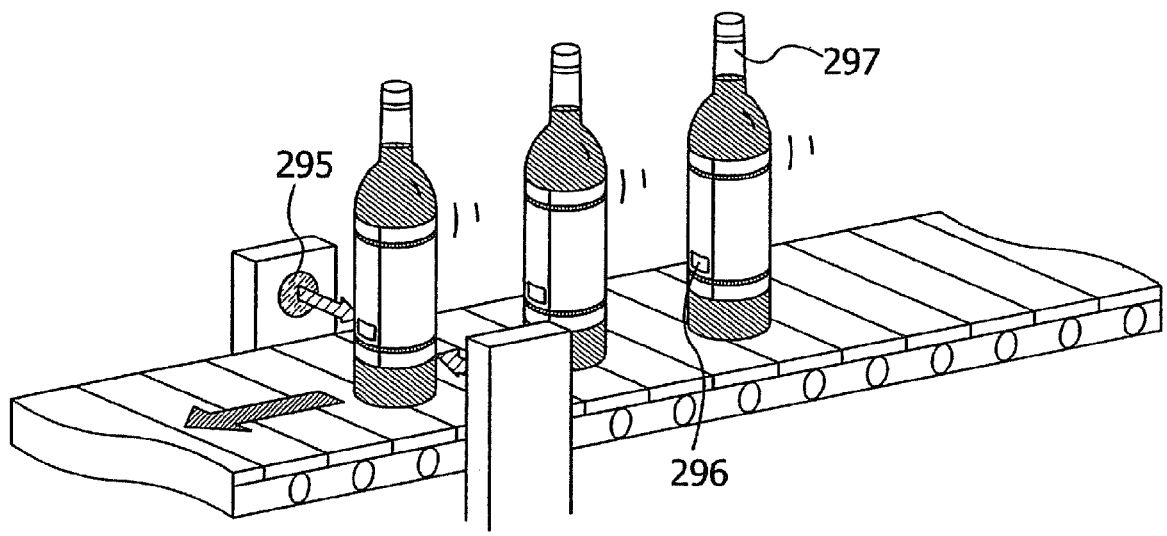

Furthermore, by applying the IC chip (an RF tag, a wireless tag, an electronic tag, a wireless processor, a wireless memory, or the like) including the thin film integrated circuit to a management system and a circulation system of objects, the system can become more sophisticated. For example, an example is given in which a reader/writer 295 is provided at a side face of a mobile terminal including a display portion 294, and the IC chip (an RF tag, a wireless tag, an electronic tag, a wireless processor, a wireless memory, or the like) 296 including the thin film integrated circuit is provided at a side face of an object 297 (refer to FIG. 17A). In this system, when the IC chip (an RF tag, a wireless tag, an electronic tag, a wireless processor, a wireless memory, or the like) 296 including the thin film integrated circuit is held over the reader/writer 295, the display portion 294 displays information of the object 297 such as a material, a production area, a history of circulation process, and the like. As another example, the reader/writer 295 is provided beside the belt conveyer (refer to FIG. 17B). In this case, the object 297 can be easily inspected.

The present embodiment can be freely combined with the Embodiment Modes 1 to 5, and Embodiment 1.

Embodiment 3

In many cases, an IC chip has only a thin film integrated circuit between a first film or a resin layer and a second film. However, according to the present invention, the substrate and the thin film integrated circuit are provided between the first film or the resin layer and the second film. This characteristic makes it possible to prevent the intrusion of harmful gas, water, and impurity elements. Therefore, an IC chip in which the deterioration and damage of the thin film integrated circuit are suppressed and the reliability is enhanced can be provided.

The substrate included in the IC chip of the present invention preferably has a thickness of 50 µm or less, more preferably 1 to 20 µM, and much more preferably 1 to 5 µm. By conducting the grinding step and the polishing step to thin the substrate so as to have the above thickness, an IC chip having flexibility can be provided.

Each of the first film or the resin layer 12, the second film 13, the first base 20, the second base 22, the film 33, the first tape 40, and the second tape 41 corresponds to a material such as polypropylene, polyester, vinyl, polyvinyl fluoride, vinyl chloride, ethylene vinyl acetate, urethane, or polyethylene terephthalate, a paper made of a fiber material, or the like. The surfaces of the films, the bases, and the tapes may be coated with silicon dioxide (silica) or aluminum oxide (alumina). Because of the coating, water-resistant properties can be kept even under a high-temperature and high-humidity environment. Further, the surface or the interface between the films, the bases, and the tapes and the adhesive agent may be coated with a conductive material such as indium tin oxide. Since the coated material prevents electrostatic charge, the thin film integrated circuit can be protected from the electrostatic. As the method providing the similar effect, it is effective that carbon black or surface-active agent is added to the film material. Furthermore, the surfaces may be coated with thin film mainly containing carbon (e.g. a diamond-like carbon film). The strength can be increased by the coating, and the damage of the thin film integrated circuit can be suppressed. The surfaces may have adhesive planes on which an adhesive agent such as a thermoset resin, an ultraviolet curable resin, or an epoxy resin adhesive agent is applied. Each of the first film or the resin layer 12, the second film 13, the first base 20, the second base 22, the film 33, the first tape 40, and the second tape 41 may have light-transmitting properties. All of the first film or the resin layer 12, the second film 13, the film 33, the first base 20, the second base 22, the first tape 40, and the second tape 41 are formed with the same material. Therefore, the base and the tape correspond to the film.

The present invention includes the step of polishing the ground surface of the substrate 10 by the polishing means 16 (refer to FIG. 1C). The thickness of the polished substrate 10 is not limited in particular; however, it is preferable that the thickness be 50 µm or less, more preferably 1 to 20 µm, and much more preferably 1 to 5 µm. The thickness of the polished substrate 10 may be determined appropriately in consideration of the strength of the polished IC chip, the time required for the polishing step, the time required for the cutting step, the application of the IC chip, and the like.

For example, in the case of improving the productivity by shortening the time of the polishing step, the thickness of the polished substrate 10 is preferably set to approximately 50 µm. In the case of pasting or embedding the IC chip to a thin object, the thickness of the polished substrate 10 is preferably set to approximately 1 to 20 µm, more preferably 1 to 5 µm. In the case of improving the productivity by shortening the time of the cutting step, the thickness of the polished substrate 10 is preferably set to approximately 1 to 20 µm, more preferably 1 to 5 µm.

The present invention includes the step of forming the thin film integrated circuit over one face of the substrate. However, the structure of the thin film integrated circuit is different depending on the application of the IC chip. For example, when an IC chip for sending and receiving the electromagnetic wave is manufactured, a plurality of elements (a thin film transistor, a capacitor, a resistor, and the like) and a conductive layer functioning as an antenna are formed as the thin film integrated circuit. Moreover, when an IC chip for storing data is manufactured, a storage element and a plurality of elements (a thin film transistor, a capacitor, a resistor, and the like) for controlling the storage element are formed as the thin film integrated circuit. When an IC chip for controlling circuits or generating signals (such as a CPU, a signal generator circuit, and the like) is manufactured, a plurality of elements (a thin film transistor, a capacitor, a resistor, and the like) is formed as the thin film integrated circuit.

Note that the present embodiment can be freely combined with the Embodiment Modes 1 to 5, Embodiments 1 and 2.

Embodiment 4

Figure 18:
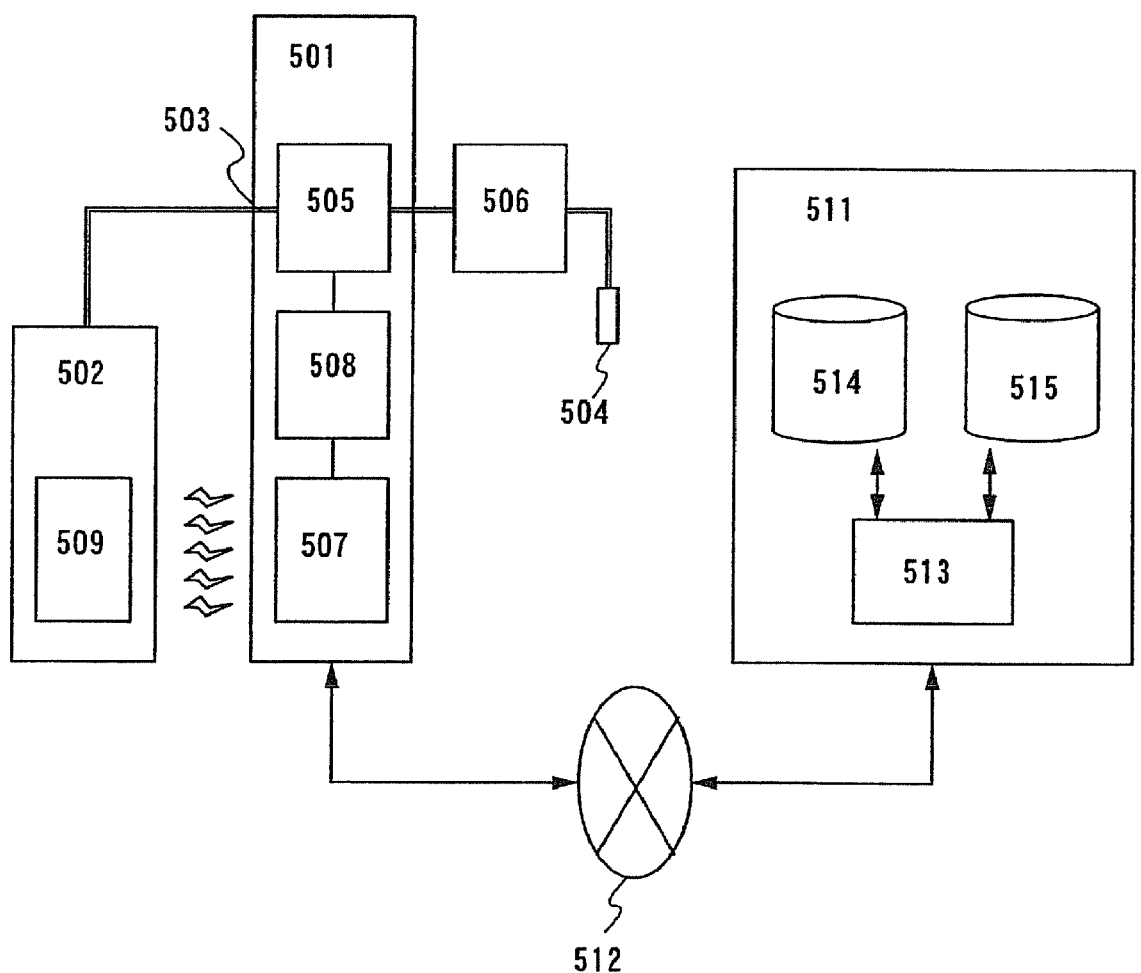
FIG. 18 is a view illustrating an application of an IC chip of the present invention (Embodiment 4)

The present embodiment will describe a management system at distribution of a container filled with a fluid from a manufacturer to a delivery agent and the like, referring to FIG. 18.

A management system of a container filled with a fluid shown in FIG. 18 includes a supplier 501 and a container 502 filled with a fluid. The supplier 501 is provided with an introduction tube 503 for introducing the fluid from the container, a supplying nozzle 504 for supplying the fluid to the outside, a first valve 505 for controlling movement of the fluid introduced from the introduction tube to the supplying nozzle, a second valve 506 which controls movement of the fluid from the first valve to the supplying nozzle, a reader/writer 507 which reads information stored in an IC chip, and a control portion 508 which controls the first valve based on a signal sent from the reader/writer.

The container 502 is provided with the IC chip 509 shown in Embodiment Modes and Embodiments as above. In the IC chip 509, information of the fluid filling the container 502, such as a manufacturing date, a manufacturer, and a material are stored. The information is managed at a management center 511 in the manufacturer. The IC chip 509 may be provided with a battery. By providing a battery, the IC chip can automatically send information to the reader/writer. Further, the IC chip 509 may have a detection portion. The information on the fluid detected in the detection portion can be sent to the management center of the manufacturer through the reader/writer and an interface.

The container 502 is formed with metal, plastic, ceramic, or the like.

As typical examples of the fluid filling the container 502, liquid such as drinkable water, hot spring water, or daily life water; gas such as propane gas, natural gas, hydrogen gas, oxygen gas, or nitrogen gas; or gel-like fluid such as paste, ice cream, or soup is given. Note that when the container 502 is filled with propane gas, natural gas, hydrogen gas, oxygen gas, or nitrogen gas, a steel cylinder is preferably used as the container 502.

When the container 502 is connected to the supplier 501, the reader/writer 507 of the supplier 501 reads information stored in the IC chip 509 of the container 502. Next, the information read by the reader/writer is sent to the management center 511 of the manufacturer through an interface 512. The interface 512 sends the information stored in the IC chip 509 to the outside and serves as a terminal-side information sending/receiving means for receiving a signal from the management center 511. Internet, a telephone line, or the like can be used as the interface 512.

The information of the fluid sent from the interface 512 is sent to a server 513 in the management center 511 of the manufacturer. The information of the fluid, specifically a used-by date, an expiration date, a manufacturer, and a material, are judged at the server 513 in the management center. In the case that the IC chip 509 is provided with a detection portion, it is possible to receive various information of the fluid like the freshness, the temperature, and the like, in addition to the above information of the fluid. Here, whether the fluid is supplied or not is judged by judging the conformity of the choice of the container 502 and the supplier 501, and the used-by date, the expiration date, and the manufacturer of the fluid, based on a shipment list 514 of the containers and a list 515 of the used containers. In the management center 511 of the manufacturer, the shipment list 514 of the containers and the list 515 of the used containers are stored in the server 513.

Next, the judgment result on whether the fluid is supplied or not is sent from the management center 511 to the supplier 501. The transmission result from the management center is received with the reader/writer 507 of the supplier 501. If the fluid is to be supplied, a signal is sent to the control portion 508 of the supplier, and the first valve 505 is opened. When a store clerk opens the second valve 506, the fluid can be supplied to the outside through the supplying nozzle 504. It is preferable that the first valve 505 be automatically controllable, and the first valve 505 can be formed with an electromagnetic valve. It is preferable that the second valve 506 be manually controllable or automatically controllable and the second valve 506 can be formed with a manual valve or an automatic valve. If the second valve 506 is automatically controllable, the opening and closing of the valve is controlled with an electromagnetic valve connected to a switch operated by a store clerk.

By using such a system, the manufacturers can figure out the amount of consumption of the fluid at the delivery agents. Thus, the shipment management of the containers filled with the fluid can be carried out automatically, which simplifies the step of shipping and receiving orders at the delivery agents and the manufacturers.

Since the opening and closing of the first valve 505 is controlled by the information stored in the IC chip 509, it becomes possible to control the supplying of the fluid automatically. Therefore, it can be prevented that the fluid beyond the used-by date and the expiration date, the fluid which has been deteriorated because of being in a poor state of preservation, and the like are provided to purchasers.

Moreover, it is possible to discriminate the container 502 and the fluid filling the container 502 manufactured by one's company from containers and fluid manufactured by the other companies, based on the information stored in the IC chip 509. Therefore, it is possible to prevent the fluid of the same kind manufactured by the other company from being supplied in connection with the supplier manufactured by the one's company.

By using the IC chip manufactured by the present invention in the present embodiment, the intrusion of harmful gas, water, and impurity elements can be prevented. Therefore, an IC chip in which the deterioration and damage of the thin film integrated circuit are suppressed and the reliability is enhanced can be provided. Note that the present embodiment can be freely combined with Embodiment Modes 1 to 5, and Embodiments 1 to 3.

The present application is based on Japanese Priority application No. 2005-158376 filed on May 31, 2005 with the Japanese Patent Office, the entire contents of which are hereby incorporated by reference.

What is claimed is:

1. A semiconductor device comprising:
 a first base;
 a silicon substrate over the first base;
 an insulating film over the silicon substrate;
 a layer comprising a thin film transistor over the insulating film, wherein the thin film transistor comprises a semiconductor region; and
 a second base over the layer,
 wherein the first base is touched with the second base,
 wherein at least one of a phase state and electric properties of the silicon substrate material is not identical with that of the semiconductor region of the thin film transistor, and
 wherein the thickness of the silicon substrate is not less than 1 μm and not more than 20 μm.

2. The semiconductor device according to claim 1, further comprising a resin layer between the layer and the second base.

3. The semiconductor device according to claim 1, wherein the silicon substrate is a polycrystalline silicon substrate.

4. The semiconductor device according to claim 1, wherein the silicon substrate is a single crystalline silicon substrate.

5. The semiconductor device according to claim 1, wherein the semiconductor device is an IC chip.

6. A semiconductor device comprising:
 a first base;
 a silicon substrate over the first base;
 an insulating film over the silicon substrate;
 a layer comprising a thin film transistor over the insulating film; and
 a second base over the layer,
 wherein the first base is touched with the second base, and
 wherein the thickness of the silicon substrate is not less than 1 μm and not more than 20 μm.

7. The semiconductor device according to claim 6, further comprising a resin layer between the layer and the second base.

8. The semiconductor device according to claim 6, wherein the silicon substrate is a polycrystalline silicon substrate.

9. The semiconductor device according to claim 6, wherein the silicon substrate is a single crystalline silicon substrate.

10. The semiconductor device according to claim 6, wherein the semiconductor device is an IC chip.

11. A semiconductor device comprising:
 a first base;
 a semiconductor substrate over the first base;
 an insulating film over the semiconductor substrate;
 a layer comprising a thin film transistor over the insulating film, wherein the thin film transistor comprises a semiconductor region; and
 a second base over the layer,
 wherein the first base is touched with the second base,
 wherein at least one of a phase state and electric properties of the semiconductor substrate material is not identical with that of the semiconductor region of the thin film transistor, and
 wherein the thickness of the semiconductor substrate is not less than 1 μm and not more than 20 μm.

12. The semiconductor device according to claim 11, further comprising a resin layer between the layer and the second base.

13. The semiconductor device according to claim 11, wherein the semiconductor substrate is a polycrystalline silicon substrate.

14. The semiconductor device according to claim 11, wherein the semiconductor substrate is a single crystalline silicon substrate.

15. The semiconductor device according to claim 11, wherein the semiconductor device is an IC chip.

16. A semiconductor device comprising:

a first base;

a semiconductor substrate over the first base;

an insulating film over the semiconductor substrate;

a layer comprising a thin film transistor over the insulating film; and a second base over the layer, wherein the first base is touched with the second base, and wherein the thickness of the semiconductor substrate is not less than 1 µm and not more than 20 µm.

17. The semiconductor device according to claim 16, further comprising a resin layer between the layer and the second base.

18. The semiconductor device according to claim 16, wherein the semiconductor substrate is a polycrystalline silicon substrate.

19. The semiconductor device according to claim 16, wherein the semiconductor substrate is a single crystalline silicon substrate.

20. The semiconductor device according to claim 16, wherein the semiconductor device is an IC chip.

* * * * *